United States Patent
Le et al.

(10) Patent No.: US 10,849,234 B2
(45) Date of Patent: Nov. 24, 2020

(54) PREPARATION OF ELECTRICAL CIRCUITS BY ADHESIVE TRANSFER

(71) Applicant: 3M INNOVATIVE PROPERTIES COMPANY, St. Paul, MN (US)

(72) Inventors: John D. Le, Woodbury, MN (US); Moses M. David, Woodbury, MN (US); Jeffrey W. McCutcheon, Baldwin, WI (US); Hung T. Tran, Stanton, CA (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 54 days.

(21) Appl. No.: 16/155,468

(22) PCT Filed: Apr. 10, 2017

(86) PCT No.: PCT/US2017/026776
§ 371 (c)(1),
(2) Date: Nov. 9, 2018

(87) PCT Pub. No.: WO2017/180502
PCT Pub. Date: Oct. 19, 2017

(65) Prior Publication Data
US 2020/0029443 A1    Jan. 23, 2020

Related U.S. Application Data

(60) Provisional application No. 62/322,879, filed on Apr. 15, 2016.

(51) Int. Cl.
*H05K 3/04* (2006.01)
*H05K 3/00* (2006.01)
(Continued)

(52) U.S. Cl.
CPC ......... *H05K 3/048* (2013.01); *B32B 37/025* (2013.01); *H05K 3/007* (2013.01);
(Continued)

(58) Field of Classification Search
CPC .......... H05K 2201/09036; H05K 2201/09045; H05K 2203/0108; H05K 2203/0121;
(Continued)

(56) References Cited

U.S. PATENT DOCUMENTS 4,472,480 A    9/1984 Olson
4,567,073 A    1/1986 Larson
(Continued)

FOREIGN PATENT DOCUMENTS

JP    2011-230320    11/2011
JP    2011-230466    11/2011
(Continued)

OTHER PUBLICATIONS

English translation of claims of JP2013-089841.*
(Continued)

*Primary Examiner* — Sonya M Sengupta
(74) *Attorney, Agent, or Firm* — Jeffrey M. Olofson

(57) ABSTRACT

Multilayer articles that include electrical circuits are prepared by the adhesive transfer of electrical circuit elements to the surface of an adhesive. A number of different methodologies are used, with all of the methodologies including the use of simple layers of circuit-forming material on a releasing substrate and structuring to generate circuit elements which can be transferred to an adhesive surface. In some methodologies, a structured releasing substrate is used to selectively transfer circuit-forming material, either from protrusions on the releasing substrate or from depressions on the releasing substrate. In other methodologies, an unstructured releasing substrate is used and either embossed to form a structured releasing substrate or contacted with a structured adhesive layer to selectively transfer circuit-forming material.

23 Claims, 7 Drawing Sheets

(51) Int. Cl.
  B32B 37/00 (2006.01)
  B32B 37/26 (2006.01)
  B44C 3/00 (2006.01)
(52) U.S. Cl.
  CPC ......... *B32B 2037/268* (2013.01); *B44C 3/005* (2013.01); *H05K 2203/0108* (2013.01); *H05K 2203/0121* (2013.01); *H05K 2203/095* (2013.01)
(58) Field of Classification Search
  CPC ..... H05K 2203/0528; H05K 2203/095; H05K 3/0014; H05K 3/007; H05K 3/048; H05K 3/1275; H05K 3/146; H05K 3/321; B32B 37/025; B32B 2037/268; B44C 3/005
  See application file for complete search history.

(56) References Cited

U.S. PATENT DOCUMENTS

| | | |
|---|---|---|
| 4,614,667 A | 9/1986 | Larson |
| 5,049,434 A | 9/1991 | Wasulko |
| 5,110,384 A | 5/1992 | Dudek |
| 5,219,655 A | 6/1993 | Caolhoun |
| 5,328,534 A | 7/1994 | Calhoun |
| 5,761,801 A | 6/1998 | Gebhardt |
| 5,798,138 A | 8/1998 | Legierse |
| 9,109,145 B2 | 8/2015 | Li |
| 2003/0015348 A1 | 1/2003 | Lee |
| 2005/0060886 A1 | 3/2005 | Tsukahara |
| 2005/0118352 A1 | 6/2005 | Suwa |
| 2014/0272565 A1 | 9/2014 | Gronwald |

FOREIGN PATENT DOCUMENTS

| | | |
|---|---|---|
| WO | WO 2010-012540 | 2/2010 |
| WO | WO 2014-141512 | 9/2014 |
| WO | WO 2016-064565 | 4/2016 |

OTHER PUBLICATIONS

English translation of description of JP2013-089841.*
English translation of Written Opinion for JP2011230466.*
English translation of Search Report for JP2011230466.*
Translation of WO2014/141512.*
Translation of WO2010/012540.*
International Search report for PCT International Application No. PCT/US2017/026776 dated Jul. 3, 2017, 5 pages.

\* cited by examiner

PREPARATION OF ELECTRICAL CIRCUITS BY ADHESIVE TRANSFER

FIELD OF THE DISCLOSURE

This disclosure relates generally to electrical circuits and methods for preparing electrical circuits.

BACKGROUND

The electronics industry requires a wide range of electrical circuits. These circuits have become smaller and smaller in size, making their preparation increasingly difficult. In general two types of processes are used to prepare electrical circuits, additive processes and subtractive processes.

In additive processes, the elements of the circuit are formed on a surface by adding a material to a surface. In some processes the material is applied to the surface in a pattern which forms the circuit. Examples of suitable processes include things like printing of a conductive ink to a surface. In other examples of this process, the surface is masked. In these processes, a blanket coating can be added by, for example, deposition of a thin metal layer by sputtering. When the mask is removed only the unmasked portions have a thin layer of metal.

In subtractive processes, a continuous layer of material, such as a thin layer of metal, is selectively removed to form the circuit. Examples of suitable removal processes include etching and laser ablation. Again the surface can be masked to protect the portions to not be removed prior to the removal process.

Each of these processes has advantages and disadvantages. In some instances, it is desirable to have a small circuit present on surfaces that can be problematic for these processes as the surfaces can be sensitive to these processes. An example of such a surface is an adhesive surface. Adhesives are generally elastomeric or viscoelastomeric in nature, and thus the surface may be damaged by deposition of metals, etc. Additionally, since adhesives are non-rigid, it can be difficult to form circuits on the adhesive surface. The formation of circuits on adhesive surfaces is desirable particularly to form laminates in which the circuit is located between an adhesive layer and a substrate layer.

A number of methods have been used that involve electrical circuits or electrical circuit precursors in conjunction with adhesive layers. For example, U.S. Pat. No. 5,761,801 (Gebhardt et al.) describes a method for making a conductive film composite containing a controlled-flow dielectric thermosetting resin film layer and a heat and electrically conductive metal foil layer in direct adhesive bonding with aside of the resin film. The method involves adhesively bonding an electrically conductive metal foil layer to the dielectric thermosetting resin film layer.

U.S. Pat. No. 5,110,384 (Dudek et al.) describes a process for making an electrically conductive pattern on a substrate including forming a patterned adhesive layer on the substrate, applying a conductive metal powder to the adhesive layer, and in a second coating pass, applying a powder containing supplementary elements to the pattern. The patterned substrate is fired to volatilize the adhesive layer and sinter the powders.

SUMMARY

Disclosed herein are methods of preparing electrical circuits on a surface, and multilayer articles including electrical circuits. While a number of different methodologies are disclosed, all of the methodologies comprise the use of simple layers of circuit-forming material on a releasing substrate and structuring to generate circuit elements which can be transferred to an adhesive surface.

The first methodology involves a method of preparing an electrical circuit on a surface comprising providing a structured releasing substrate having a series of protrusions and depressions on the surface of the releasing substrate, with a fluorinated release layer on the surface of the releasing substrate. The fluorinated release layer comprises a release surface prepared by plasma deposition. A layer of circuit-forming material is formed on the release layer on the surface of the structured releasing substrate. An adhesive layer is contacted to the circuit-forming material on protrusions of the structured releasing substrate. The adhesive layer is removed from the surface of the structured releasing substrate, such that at least a portion of the circuit-forming material on the protrusions of the structured releasing substrate at least partially adheres to the surface of the adhesive layer upon removal to form an adhesive surface with an electrical circuit on it.

The first methodology can be further extended to form a different electrical circuit on an adhesive surface. In this embodiment, the steps above are carried out, namely a structured releasing substrate having a series of protrusions and depressions on the surface of the releasing substrate, with a fluorinated release layer on the surface of the releasing substrate. The fluorinated release layer comprises a release surface prepared by plasma deposition. A layer of circuit-forming material is formed on the release layer on the surface of the structured releasing substrate. An adhesive layer is contacted to the circuit-forming material on protrusions of the structured releasing substrate. The adhesive layer is removed from the surface of the structured releasing substrate, such that at least a portion of the circuit-forming material on the protrusions of the structured releasing substrate at least partially adheres to the surface of the adhesive layer upon removal to form an adhesive surface with an electrical circuit on it. The resulting releasing substrate is contacted with an adhesive layer or a pre-adhesive layer such that the adhesive layer or pre-adhesive layer contacts to the circuit-forming material located in the depressions of the structured releasing substrate. If the adhesive layer is a pre-adhesive layer, the pre-adhesive layer is cured to form an adhesive layer, and the adhesive layer is removed from the surface of the structured releasing substrate, such that at least a portion of the circuit-forming material in the depressions of the structured releasing substrate at least partially adheres to the surface of the adhesive layer upon removal to form an adhesive surface with an electrical circuit on it.

The second methodology involves a method of preparing an electrical circuit on a surface comprising providing an unstructured releasing substrate having a fluorinated release layer on the surface of the releasing substrate, where the fluorinated release layer comprises a release surface prepared by plasma deposition. A layer of circuit-forming material is formed on the release layer on the surface of the releasing substrate. An embossing tool comprising a surface with protrusions and depressions is embossed against the layer of circuit-forming material on the release layer on the surface of the releasing substrate with pressure to prepare an embossed surface in the layer of circuit-forming material on the release layer on the surface of the releasing substrate. This embossing includes the application of pressure or a combination of heat and pressure. The embossing tool is removed from the layer of circuit-forming material on the release layer on the surface of the releasing substrate. An adhesive layer is contacted to the circuit-forming material on the embossed protrusions of the embossed surface of the releasing substrate. The adhesive layer is removed from the embossed surface of the releasing substrate, such that at least a portion of the circuit-forming material on the embossed protrusions of the releasing substrate at least partially adheres to the surface of the adhesive layer upon removal to form an adhesive surface with an electrical circuit on it.

The third methodology involves a method of preparing an electrical circuit on a surface comprising providing an unstructured releasing substrate having a fluorinated release layer on the surface of the releasing substrate, where the fluorinated release layer comprises a release surface prepared by plasma deposition. A layer of circuit-forming material is formed on the release layer on the surface of the releasing substrate. A structured adhesive layer comprising a surface with protrusions and depressions is contacted to the layer of circuit-forming material on the release layer on the surface of the releasing substrate such that only the protrusions of the structured adhesive layer contact the layer of circuit-forming material. The adhesive layer is removed from the releasing substrate, such that at least a portion of the circuit-forming material on the protrusions of the structured adhesive layer at least partially adheres to the surface of the adhesive layer upon removal to form an adhesive surface with an electrical circuit on it.

The third methodology can be further extended to form a different electrical circuit on an adhesive surface. In this embodiment, the steps above are carried out, namely providing an unstructured releasing substrate having a fluorinated release layer on the surface of the releasing substrate, where the fluorinated release layer comprises a release surface prepared by plasma deposition. A layer of circuit-forming material is formed on the release layer on the surface of the releasing substrate. A structured adhesive layer comprising a surface with protrusions and depressions is contacted to the layer of circuit-forming material on the release layer on the surface of the releasing substrate such that only the protrusions of the structured adhesive layer contact the layer of circuit-forming material. The adhesive layer is removed from the releasing substrate, such that at least a portion of the circuit-forming material on the protrusions of the structured adhesive layer at least partially adheres to the surface of the adhesive layer upon removal to form an adhesive surface with an electrical circuit on it. The resulting releasing substrate is contacted with an adhesive layer or a pre-adhesive layer such that the adhesive layer or pre-adhesive layer contacts the circuit-forming material remaining on the unstructured releasing substrate. If the adhesive layer is a pre-adhesive layer, the pre-adhesive layer is cured to form an adhesive layer, and the adhesive layer is removed from the surface of the unstructured releasing substrate, such that at least a portion of the circuit-forming material located on the surface of the unstructured releasing substrate at least partially adheres to the surface of the adhesive layer upon removal to form an adhesive surface with an electrical circuit on it.

Also disclosed are multilayer articles containing electrical circuits. In some embodiments, the multilayer article comprises an adhesive layer comprising a first major surface and a second major surface, an electrical circuit in contact with at least a portion of the first major surface of the adhesive layer, and a structured releasing substrate with a first major surface and a second major surface, wherein the second major surface comprises a structured surface comprising a series of protrusions and depressions on the surface of the releasing substrate, and having a fluorinated release layer on the surface of the releasing substrate. At least a portion of the second major surface of the releasing substrate is in contact with the electrical circuit. In some further embodiments of the multilayer articles, the releasing substrate has been removed to expose the electrical circuit and the adhesive layer.

BRIEF DESCRIPTION OF THE DRAWINGS

The present application may be more completely understood in consideration of the following detailed description of various embodiments of the disclosure in connection with the accompanying drawings.

Figure 1A:
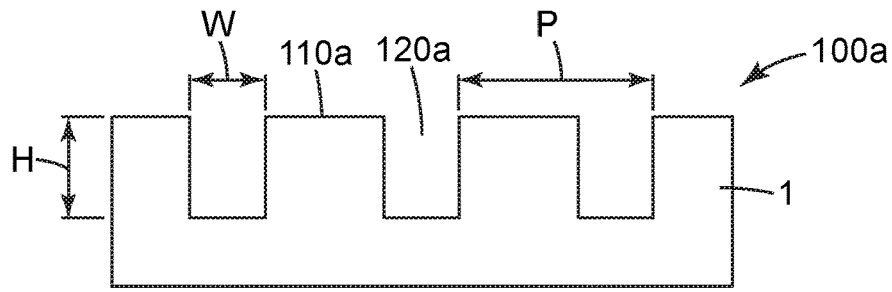
FIG. 1, containing subfigures 1a-1f, is a cross sectional view of an embodiment of a method for preparing an electrical circuit of the present disclosure. The method corresponds with Example 1.

In the following description of the illustrated embodiments, reference is made to the accompanying drawings, in which is shown by way of illustration, various embodiments in which the disclosure may be practiced. It is to be understood that the embodiments may be utilized and structural changes may be made without departing from the scope of the present disclosure. The figures are not necessarily to scale. Like numbers used in the figures refer to like components. However, it will be understood that the use of a number to refer to a component in a given figure is not intended to limit the component in another figure labeled with the same number.

DETAILED DESCRIPTION

The formation of electrical circuits on an adhesive layer is desirable in particular to form laminates in which the electrical circuit is located between an adhesive layer and a substrate layer. Various techniques have been used that involve either directly printing the circuit onto an adhesive layer surface or by etching a circuit into a layer of metal adhered to the surface of the adhesive layer. However, such processes can damage the adhesive surface. Additionally, since the adhesive layer is a non-rigid layer, it can be difficult to achieve precision in either printing on or etching from a non-rigid surface. Even small movement in the non-rigid surface layer can create defects in the circuit.

The advantages of forming an electrical circuit on an adhesive layer are many because the adhesive retains the integrity of the circuit during handling even with very thin circuits. Additionally, not only can the electrical circuit on an adhesive layer be used to form laminate articles by lamination to the adhesive layer, the circuit can be transferred from the adhesive layer to a different adhesive surface. In this way, the adhesive layer can function as a carrier layer to transport the circuit to a different surface.

As was mentioned above, electrical circuits are becoming more and more compact, not only in length and width, but also in thickness. It can problematic to form small features out of metal and when formed, the small and thin layers of metal are very fragile, and difficult to handle. Therefore it is desirable to find new ways to form and handle electrical circuits.

The formation of small and thin metal features for electrical circuits can be very difficult. In contrast, the formation of continuous thin metal layers is relatively easy to do with techniques such as sputtering and vacuum deposition. However, such techniques are difficult to adapt to make small metal features. Two common methods for making small metal features from continuous thin metal layers are the use of masking and the use of etching. When masking is used, a mask is placed over a surface such that only in places that are unmasked does the sputtered metal get through to the surface. This can be very effective but becomes impractical as the size of the metal features gets smaller and smaller. When etching is used, the undesired metal portions are removed to leave behind the desired metal features, but again as the metal features get smaller and smaller, etching also becomes impractical. Also, in both instances, once the circuit is made, it is very fragile and handling can be difficult.

In this disclosure, methods are described for preparing electrical circuits on an adhesive surface by adhesive transfer. These methods involve the formation of a metal coating on the surface of a releasing substrate, and contacting the electrical circuit on the surface of the releasing substrate with an adhesive layer or a pre-adhesive layer to selectively contact portions of the metal coating with the adhesive layer. A pre-adhesive layer is a layer of material which upon curing forms an adhesive layer. If the layer is a pre-adhesive layer, the layer is cured to form an adhesive layer. The adhesive layer is then removed from the releasing substrate, and the selectively contacted metal is transferred from the releasing substrate surface to the adhesive layer surface. The selectively transferred metal comprises an electrical circuit. In this way, an adhesive layer with an electrical circuit adhered to its surface can be formed without the difficulties inherent in forming the electrical circuit directly on the adhesive surface.

There are three different methodologies for effecting the transfer of an electrical circuit to an adhesive layer. All of the methodologies involve the use of a structured surface to effect the transfer. Two of the methodologies involve the use of a structured release substrate, the other methodology involves the use of a structured adhesive layer.

In the first methodology, a structured polymeric sheet comprising a series of protrusions is converted to a structured release liner by plasma deposition of a release layer. This plasma deposition is explained in detail below, and forms a release surface which is robust enough to permit the release of vacuum deposited metal. The release liner generated by plasma deposition of a release layer is then coated with one or more metals to form a thin metal coating. The metal coated release liner is then contacted to an adhesive or pre-adhesive layer. If a pre-adhesive layer is used the pre-adhesive layer is cured to form an adhesive layer. The adhesive layer is then removed from the release liner such that only the portions of the metal coating that was present on the protrusions of the release liner are transferred to the adhesive layer. The transferred metal comprises an electrical circuit present on the adhesive layer.

In the second methodology, an unstructured polymeric sheet is converted to a release liner by plasma deposition of a release layer. This plasma deposition is explained in detail below, and forms a release surface which is robust enough to permit the release of vacuum deposited metal. The release liner generated by plasma deposition of a release layer is then coated with one or more metals to form a thin metal coating. The metal coated release liner is then contacted to an embossing tool which imparts a structured pattern comprising a series of protrusions to the metal coated release liner. The metal coated structured release liner is then contacted to an adhesive or pre-adhesive layer. If a pre-adhesive layer is used the pre-adhesive layer is cured to form an adhesive layer. The adhesive layer is then removed from the release liner such that only the portions of the metal coating that was present on the protrusions of the release liner are transferred to the adhesive layer. The transferred metal comprises an electrical circuit present on the adhesive layer.

In the third methodology, an unstructured polymeric sheet is converted to a release liner by plasma deposition of a release layer. This plasma deposition is explained in detail below, and forms a release surface which is robust enough to permit the release of a thinly coated layer of metal. The release liner generated by plasma deposition of a release layer is then coated with one or more metals to form a thin metal coating. The metal coated release liner is then contacted with a structured adhesive layer. The structured adhesive layer has a surface topography that comprises a series of protrusions. The adhesive layer is then removed from the release liner such that only the portions of the metal coating that contacted the protrusions of the adhesive layer are transferred to the adhesive layer. The transferred metal comprises an electrical circuit present on the adhesive layer.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. For example, reference to "a layer" encompasses embodiments having one, two or more layers. As used in this specification and the appended claims, the term "or" is generally employed in its sense including "and/or" unless the content clearly dictates otherwise.

The term "adhesive" as used herein refers to polymeric compositions useful to adhere together two adherends. Examples of adhesives are heat activated adhesives, and pressure sensitive adhesives.

Heat activated adhesives are non-tacky at room temperature but become tacky and capable of bonding to a substrate at elevated temperatures. These adhesives usually have a Tg or melting point (Tm) above room temperature. When the temperature is elevated above the Tg or Tm, the storage modulus usually decreases and the adhesive become tacky.

Pressure sensitive adhesive compositions are well known to those of ordinary skill in the art to possess at room temperature properties including the following: (1) aggressive and permanent tack, (2) adherence with no more than finger pressure, (3) sufficient ability to hold onto an adherend, and (4) sufficient cohesive strength to be cleanly removable from the adherend. Materials that have been found to function well as PSAs are polymers designed and formulated to exhibit the requisite viscoelastic properties resulting in a desired balance of tack, peel adhesion, and shear holding power. Obtaining the proper balance of properties is not a simple process.

The terms "glass transition temperature" and "Tg" are used interchangeably. The Tg when measured, is measured using DSC (Differential Scanning calorimetry) using standard techniques (typically a heating rate of 10° C. per minute) unless otherwise indicated. More typically, the Tg is not measured but rather is calculated with the well-understood Fox equation using the monomer Tg values provided by the monomer supplier, as is well understood by one of skill in the polymer arts.

The term "releasing surface" as used herein refers to a surface that provides low adhesive strength to adhesives, especially pressure sensitive adhesives. Examples of releasing surfaces include the surfaces of release liners.

The term "release liners" as used herein refers to articles containing at least one release surface. When adhered to an adhesive layer, release liners adhere only lightly and are easily removed. A release liner may be a single layer (with only the base layer) or it may be a multilayer construction (with one or more coatings or additional layers in addition to the base layer). The release liner may also contain a structure or pattern such as a microstructure.

The term "molecular weight" as used herein typically refers to the number average molecular weight unless otherwise noted. The units of molecular weight are grams per mole or Daltons.

The term "nanoparticle" as used herein (unless an individual context specifically implies otherwise) will generally refer to particles, groups of particles, particulate molecules (i.e., small individual groups or loosely associated groups of molecules) and groups of particulate molecules that while potentially varied in specific geometric shape have an effective, or average, diameter that can be measured on a nanoscale (i.e., less than about 100 nanometers).

As used herein, the term "circuit-forming material" refers to a material when deposited on a releasing substrate and adhesively transferred to the surface of an adhesive layer forms an electrical circuit on the adhesive surface. Examples of circuit-forming materials include metals such as silver, copper, and the like, metal alloys, and conductive metal oxides such as ITO (indium tin oxide), and the like. As metals are the most common circuit-forming material, the term metal is used interchangeably with circuit-forming material unless the context indicates that a specific material is being referred to (such as in the Examples section).

Disclosed herein are methods of preparing an electrical circuit on an adhesive surface. In some embodiments, the methods comprise providing a structured releasing substrate with a fluorinated release surface, preparing a thin layer of circuit-forming material, such as a metal layer, on the surface of the releasing substrate, providing an adhesive layer or a pre-adhesive layer, contacting the adhesive layer or pre-adhesive layer to the circuit-forming material layer on the structured surface of the releasing substrate. If the adhesive layer comprises a pre-adhesive layer, the pre-adhesive layer is cured to form an adhesive layer, and the adhesive layer is then removed from the surface of the releasing substrate. Upon removal of the adhesive layer, the portions of the circuit-forming material layer that contacted the adhesive layer at least partially adhere to the surface of the adhesive layer to form an adhesive surface with an electrical circuit on it.

In other embodiments, the methods comprise providing an unstructured releasing substrate with a fluorinated release surface, preparing a thin circuit-forming material layer, such as a metal layer, on the surface of the releasing substrate, and embossing the releasing substrate with a structured embossing tool to form a structured releasing substrate with a structured circuit-forming material layer on the surface. An adhesive layer or a pre-adhesive layer, is contacted to the circuit-forming material layer on the structured surface of the releasing substrate. If the adhesive layer comprises a pre-adhesive layer, the pre-adhesive layer is cured to form an adhesive layer, and the adhesive layer is then removed from the surface of the releasing substrate. Upon removal of the adhesive layer, the portions of the circuit-forming material layer that contacted the adhesive layer at least partially adhere to the surface of the adhesive layer to form an adhesive surface with an electrical circuit on it.

In still other embodiments, the methods comprise providing an unstructured releasing substrate with a fluorinated release surface, preparing a thin circuit-forming material layer, such as a metal layer, on the surface of the releasing substrate, providing a structured adhesive layer, contacting the structured adhesive layer to the circuit-forming material layer on the releasing substrate. The adhesive layer is then removed from the surface of the releasing substrate. Upon removal of the adhesive layer, the portions of the circuit-forming material layer that were contacted by the adhesive layer at least partially adhere to the surface of the adhesive layer to form an adhesive surface with an electrical circuit on it.

This type of process is sometimes called "adhesive transfer" and refers to the transferring of a material from a non-adhesive layer to the surface of an adhesive layer. Such adhesive transfer techniques are sometimes used, for example, with graphic articles.

Examples of suitable releasing substrates are release liners. Release liners are well understood by one of skill in the art as being articles in which the reduction of the adhesion to any layer applied to it can be accomplished by application of a release layer or coating to a thermoplastic material sheet. Typically, release coatings are applied using conventional coating techniques such as by solvent coating or hot melt coating. However, release coatings that are suitable for use in this disclosure are more robust than those prepared by conventional coating techniques. While not wishing to be bound by theory it is believed that conventionally coated release liners are unsuitable for use with circuit-forming material coatings such as metal coatings, because they are fail to effectively release the coated circuit-forming material, or if they do release the material, portions of the releasing material transfers along with the circuit-forming material, and thus contaminates the circuit-forming material.

One method of applying a release coating to the surface of the support carrier film is with plasma deposition. Such plasma deposition techniques are described in the Application: 62/066,130 titled "Insulated Glazing Units and Microoptical Layer Comprising Microstructured Diffuser and Methods" filed Oct. 20, 2014. An oligomer can be used to create a plasma cross-linked release coating. The oligomer may be in liquid or in solid form prior to coating. Typically the oligomer has a molecular weight greater than 1,000 g/mol. Also, the oligomer typically has a molecular weight less than 10,000 g/mol so that the oligomer is not too volatile. An oligomer with a molecular weight greater than 10,000 g/mol typically may be too non-volatile, causing droplets to form during coating. In one embodiment, the oligomer has a molecular weight greater than 3,000 g/mol and less than 7,000 g/mol. In another embodiment, the oligomer has a molecular weight greater than 3,500 g/mol and less than 5,500 g/mol. Typically, the oligomer has the properties of providing a low-friction surface coating. Suitable oligomers include silicone-containing hydrocarbons, reactive silicone containing trialkoxysilanes, aromatic and aliphatic hydrocarbons, fluorochemicals and combinations thereof. For example, suitable resins include, but are not limited to, dimethylsilicone, hydrocarbon based polyether, fluorochemical polyether, ethylene teterafluoroethylene, and fluorosilicones. Fluorosilane surface chemistry, vacuum deposition, and surface fluorination may also be used to provide a release coating.

Plasma polymerized thin films constitute a separate class of material from conventional polymers that can be used as release layers or coatings. In plasma polymers, the polymerization is random, the degree of cross-linking is extremely high, and the resulting polymer film is very different from the corresponding "conventional" polymer film. Thus, plasma polymers are considered by those skilled in the art to be a uniquely different class of materials and are useful in the disclosed articles. In addition, there are other ways to apply release coatings to the template layer, including, but not limited to, blooming, coating, coextrusion, spray coating, electrocoating, or dip coating. The release coating or layer may be a fluorine-containing material, a silicon-containing material, a fluoropolymer, a silicone polymer, or a poly(meth)acrylate ester derived from a monomer comprising an alkyl (meth)acrylate having an alkyl group with 12 to 30 carbon atoms. In one embodiment, the alkyl group can be branched. Illustrative examples of useful fluoropolymers and silicone polymers can be found in U.S. Pat. No. 4,472,480 (Olson), U.S. Pat. Nos. 4,567,073 and 4,614,667 (both Larson et al.). Illustrative examples of a useful poly(meth)acrylate ester can be found in US Patent Publication No. 2005/118352 (Suwa).

Plasma polymerized fluorochemical release surfaces are particularly suitable for use in the methods and articles of this disclosure. One issue that is potentially problematic with "conventional" release liner surfaces is the potential for portions of the release surface to transfer to the adhesive layer or electrical circuit as was discussed above. Such transfer is very undesirable. While not wishing to be bound by theory, it is believed that the high level of cross-linking in the plasma polymerized fluorochemical surface prevents such transfer of fluorochemical moieties to the adhesive or electrical circuit.

As mentioned above, three different but closely related methodologies for preparing electrical circuits are described in this disclosure. The first methodology utilizes a releasing substrate that comprises a structured surface. The structured surface is coated with a layer of circuit-forming material and contacted with an adhesive layer. Upon removal of the adhesive layer, the circuit-forming material selectively transfers to the adhesive layer by adhesive transfer. The second methodology utilizes a flat or unstructured releasing substrate which is coated with circuit-forming material and then embossed with a structuring tool to form a structured pattern on the release substrate and coated circuit-forming material layer. This structured substrate is contacted with an adhesive layer. Upon removal of the adhesive layer, the circuit-forming material selectively transfers to the adhesive layer by adhesive transfer. The third methodology utilizes a flat or unstructured releasing substrate which is coated with circuit-forming material and then contacted with a structured adhesive layer. Upon removal of the adhesive layer, the circuit-forming material selectively transfers to the protruding structures of the adhesive layer by adhesive transfer. Each of these methodologies will be discussed in greater detail below.

In embodiments of the first methodology, the releasing substrate comprises a structured and/or patterned release surface. By this it is meant the surface of the releasing substrate is not flat but has a structured and/or patterned surface. Structured and patterned release surfaces are well-known and understood in the art as those in which the surface of the release substrate is modified to include an array of structures, either a regular array (a pattern) or randomly distributed. This structured surface is a deliberately formed surface and is different from the surface roughness inherent in all surfaces.

Typically the structured and/or patterned release surface is prepared by embossing. This means the release substrate has an embossable surface which is contacted to a structured tool with the application of pressure and/or heat to form an embossed surface. This embossed surface is a structured surface. The structure on the embossed surface is the inverse of the structure on the tool surface, that is to say, a protrusion on the tool surface will form a depression in the embossed surface, and a depression on the tool surface will form a protrusion on the embossed surface.

Typically the structures are microstructures, meaning that they are microstructural features with at least 2 dimensions of the structures of microscopic size. The structural features may assume a variety of shapes. Representative examples include hemispheres, prisms (such as square prisms, rectangular prisms, cylindrical prisms, and other similar polygonal features), pyramids, ellipses, grooves (e.g. V-grooves), channels, and the like.

The structured release substrates of this disclosure are typically prepared by embossing a pattern into a flat embossable thermoplastic material sheet, and then forming the release surface on the structured surface through the plasma deposition process described above. Embossing of the thermoplastic material sheet is typically carried out by contacting the surface of the thermoplastic material sheet with an embossing tool with pressure or a combination of pressure and heat. Such processes are well known in the art. The embossing tool contains a pattern which the inverse of the pattern of the embossed surface layer, in other words a protrusion on the embossing tool produces a depression in the embossed surface layer, and a depression in the embossing tool produces a protrusion in the embossed surface layer. Embossing tools can be prepared from metal or polymeric materials and can have a wide range of embossing patterns in their surface.

The thermoplastic material sheet can be prepared from a wide range of polymeric materials and can have a wide range of thicknesses. Examples of suitable materials include, for example, polyester materials such as PET (polyethylene terephthalate), polyolefin materials such as PE (polyethylene), and PP (polypropylene), polyacrylates such as PMMA (polymethylmethacrylate), polyurethanes, and combinations or mixtures thereof. Typically the thermoplastic material sheet are thicker, often considerably thicker than the height of the structures on the embossing tool.

The embossed thermoplastic sheet is then plasma coated with a release layer to generate a structured releasing substrate. A layer of circuit-forming material is then applied to the release layer of the structured releasing substrate. Typically the layer of circuit-forming material is relatively thin, on the order of 100 nanometers up to 1 micrometer in thickness. Evaporative deposition is a particularly suitable method for forming the thin layer of circuit-forming material. In evaporative deposition, the source material is evaporated in a vacuum. The vacuum allows vapor particles to travel directly to the target object (substrate), where they condense back to a solid state. For example, when the circuit-forming material is metal, metal evaporation techniques are particularly suitable for form a thin layer of metal.

In some particularly desirable embodiments, the structure embossed into the surface of the releasing substrate is such that protrusions in the release surface are in the shape of the desired electrical circuit. As is described below, in this way, when circuit-forming material is applied to the structured surface, the circuit-forming material located on the protrusions as well as in the depressions. Only the circuit-forming material located on the protrusions of the releasing substrate are transferred by the adhesive layer. Typically, the adhesive layer that is contacted to the structured surface only contacts the protrusions and does not flow into the depressions located between the protrusions. In this way, when the adhesive layer is removed, because the releasing substrate is typically a fluorochemical-based surface, the circuit-forming material does not adhere well to this surface and is readily removed. However the circuit-forming material located within the depressions is not removed.

Examples of suitable circuit-forming materials include conductive and semiconductive materials such as metals and metal oxides. Examples of suitable metals include copper, chromium, aluminum, nickel, gold, silver, and tungsten or binary metal oxides doped with appropriate donor heteroatoms or containing oxygen deficiencies. Suitable conductive binary metal oxides may comprise: zinc oxide, titania, tin oxide, alumina, indium oxide, magnesia, zirconia, barium oxide, molybdenum trioxide, tungsten trioxide, and vanadium pentoxide. Particularly useful doped conductive metal oxides include Sb-doped tin oxide, Al-doped zinc oxide, In-doped zinc oxide, In-doped tin oxide, and Sb-doped zinc oxide.

Typically the circuit-forming material layer, when present on the releasing substrate, is very thin relative to the thickness of the adhesive layer. Typically the circuit-forming material layer has an average thickness of from about 100 nanometers to about 1 micrometer. In some embodiments the thickness is 100 nanometers to 500 nanometers, or even 150 nanometers to 250 nanometers.

In embodiments of forming the circuit-forming material layer that involve vapor deposition of metal, a variety of techniques are suitable, with vacuum deposition being particularly suitable. Examples of suitable metals include, for example, copper, chromium, aluminum, nickel, gold, silver, and tungsten. Typically the metal layer is relatively thin, for example between 100 nanometers to about 1 micrometer. In some embodiments the thickness is 100 nanometers to 500 nanometers, or even 150 nanometers to 250 nanometers.

Yet another embodiment of this first methodology of the present disclosure is one that utilizes the releasing substrate from which the circuit-forming material has been removed from the protrusions of the structured surface. This releasing substrate comprises a structured surface in which the protrusions are free from circuit-forming material, and the depressions comprise circuit-forming material, typically both along the sides of the depressions and along the bottom of the depressions. Generally, the circuit-forming material thickness along the sides of the depressions is less than the circuit-forming material thickness at the bottom of the depressions. This difference in thickness is generally an artifact of the method of circuit-forming material deposition.

Application of a flowable pre-adhesive composition to this releasing substrate permits the depressions to be filled with pre-adhesive. Upon curing of the pre-adhesive composition generates an adhesive layer in contact with the protrusions of the releasing substrate which are free of the circuit-forming material as well as contact with the depressions of the releasing substrate which contain circuit-forming material. Often a backing is applied to the pre-adhesive or adhesive layer to make it easier to handle the adhesive layer. When the adhesive layer is removed from the releasing substrate, the circuit-forming material from the depressions is transferred to the adhesive layer and removed from the releasing substrate. Alternatively, an adhesive layer can be used instead of curable pre-adhesive material, as long as the adhesive layer has sufficient viscous flow properties as to flow into the depressions of the releasing substrate and contact the circuit-forming material. Since such viscous flow is typically much slower than the flow of a pre-adhesive composition, pre-adhesive compositions that are subsequently cured are generally more suitable.

The advantages of this protocol are many. The same releasing substrate can be used to prepare and adhesively transfer two different electrical circuits. The first electrical circuit can be prepared on the protrusions of the releasing substrate and adhesively transferred as described above. The second electrical circuit can be prepared in the depressions of the releasing substrate and be adhesively transferred through the use of a pre-adhesive composition that is cured and then removed. In some embodiments, for example, an electrical circuit with a relatively wide cross section can readily be prepared using relatively wide protrusions, and electrical circuits with relatively thin cross sections can be prepared using the relatively narrow depressions. Typically, the protrusions have wider cross sections than the depressions so that when an adhesive layer is contacted to the protrusions the adhesive does not flow into the depressions and contact the metal on the sides and bottom of the depressions. In this way, the only circuit-forming material transferred to the adhesive layer is the circuit-forming material from the protrusions. This makes for circuit elements that are discrete without circuit-forming material located between the circuit elements. For example, if the circuit elements are straight lines of circuit-forming material such as metal, the only metal transferred is transferred within the straight lines such that there is essentially no metal located in the regions between the lines. In this way, an electrical current only flows in the straight line direction without any flow of current in the cross direction.

Additionally, if one is only interested in producing the thin circuits generated by the circuit-forming material located in the depressions of the releasing substrate, one can follow the same procedure and merely discard the circuit-forming material located on the protrusions. This circuit-forming material can be removed by adhesive transfer as described above or by some other method such as brushing, wiping, vacuuming, and the like. Once the circuit-forming material is removed from the protrusions, whether by adhesive transfer or some other means, the resulting article is a releasing substrate with electrical circuit elements located within the depressions of the structured surface of the releasing substrate. In this way, for example if the circuit-forming material is a thin layer of metal, the sensitive thin metal circuit elements are cradled within the depressions of the releasing substrate. This permits the metal circuit elements to be generated in one location and shipped to another for adhesive transfer.

The releasing substrates of this disclosure, as mentioned above have very robust releasing surfaces that permit them to be coated with a layer of circuit-forming material and, unlike conventional releasing substrates, readily release the circuit-forming material to the adhesive layer by adhesive transfer without contaminating the circuit-forming material. Additionally, the robustness of the releasing substrate also permits the releasing substrate to be used repeatedly. By this it is meant that after all of the circuit-forming material has been transferred to the adhesive layers, the releasing substrate can then be again coated with circuit-forming material suitable for transfer. In this way, multiple identical electrical circuits can be made with the same releasing substrate. One can visualize a continuous process in which a thin layer of metal, for example, is coated on the releasing substrate, the releasing substrate could then be contacted with a first adhesive layer, which upon removal transfers metal from the protrusions of the structured surface of the releasing substrate, a pre-adhesive can be applied and cured to generate a second adhesive layer which upon removal transfers metal from the depressions of the structured surface of the releasing substrate. The releasing substrate can then be returned to the start of the process which can begin again with the coating of metal. Thus the generation of one or more than one type of electrical circuit can be carried out in a continuous web-based process.

The second methodology, as described above involves the use of a circuit-forming material layer on an unstructured releasing substrate which is then embossed to structure not only the surface of the releasing substrate but also the surface of the circuit-forming material layer. In general, the embossing is carried out on the circuit-forming material layer side of the releasing substrate. In this methodology, a thermoplastic material sheet, such as those described above, are not embossed to form a pattern on the surface of the thermoplastic material sheet, rather a release layer is deposited onto the surface of the thermoplastic material sheet by the plasma deposition process described above.

The unstructured releasing sheet with a plasma deposited release layer on its surface then has a circuit-forming material layer deposited on it. The circuit-forming material layer is deposited as described above. The unstructured releasing sheet with a thin layer of circuit-forming material deposited on it is then embossed with a structured embossing tool through the circuit-forming material layer side of the releasing sheet. Suitable embossing tools have been described above. Embossing is typically carried out by contacting the surface of the thermoplastic material sheet with an embossing tool with pressure or a combination of pressure and heat.

The result of the embossing process is a structured releasing substrate with a structured layer of circuit-forming material. The structured layer of circuit-forming material is similar to the structured layer of circuit-forming material prepared in the first methodology described above, but it is also somewhat different. In particular, when the circuit-forming material layer is structured by embossing with the embossing tool, the circuit-forming material layer tends to break at the points where the structures are formed. For example, when the circuit-forming material layer is a thin layer of metal, when the embossing tool protrusions contact the thin metal layer and press down to form depressions in the releasing substrate, the metal layer tends to break. In this way when the embossing is over the metal layer abruptly ends at the end of the protrusions and there does not tend to be metal present on the sides of the depressions, only at the bottom of the depressions. In this way a continuous metal layer is made discontinuous by the embossing process.

The circuit-forming material located on the protrusions can then be adhesively transferred as described above to form an electrical circuit on an adhesive layer. Additionally, the circuit-forming material located at the base of the depressions can also be adhesively transferred using a pre-adhesive material as described above to form a second different electrical circuit on an adhesive layer.

In the third methodology of this disclosure, a thin layer of circuit-forming material is deposited on an unstructured release substrate as in the second methodology, but instead of embossing this surface with an embossing tool, the surface is instead contacted with a structured adhesive layer. In this way, only the protrusions of the adhesive layer contact the thin layer of circuit-forming material. Upon removal of the adhesive layer, the circuit-forming material that is in contact with the adhesive layer at least partially adheres to the adhesive layer and is removed from the releasing substrate, while the circuit-forming material not in contact with the adhesive layer remains on the releasing substrate.

This methodology is less general and more difficult to effect than the other two methodologies described above. A number of factors control the effectiveness of this methodology, for example if the thin layer of circuit-forming material is not sufficiently fragile to break upon removal of the adhesive layer, the transfer may not be clean, meaning that less or more circuit-forming material may transfer. If less than the desired amount transfers, the circuit formed on the adhesive layer may be incomplete or insufficiently conductive. Also, if more than the desired amount transfers, the circuit may be improperly formed and instead of conduction in only one direction, conduction in undesirable directions may be present. Control of factors such as the release force of the thin layer of circuit-forming material from the releasing substrate, the internal strength of the thin layer of circuit-forming material, and the adhesive force of the adhesive layer can be used to tailor this process as desired. It should be noted that methodologies one and two described above are more flexible and of more general applicability than methodology three.

One technique that aids the process of the third methodology is the use of very thin layers of circuit-forming material. Typically, the layer of circuit-forming material is thinner than the layers described above for the first and second methodologies. In some embodiments, the circuit-forming layer has a thickness of less than 100 nanometers. Is some embodiments the circuit-forming layer has a thickness of from 50 to 100 manometers.

A wide variety of electrical circuits can be transferred the surface of the adhesive layer. Examples of suitable electrical circuits include an RFID antenna, an LED circuit, an EMI shield, a wearable electronic sensor, or a touch screen circuit.

As described above, each methodology also comprises providing an adhesive layer or a pre-adhesive layer, contacting the adhesive layer or pre-adhesive layer to the thin layer of circuit-forming material on the surface of the releasing substrate. A wide variety of adhesive layers or pre-adhesive layers are suitable.

In some embodiments, the layer comprises an adhesive layer. A wide range of adhesive layers can be used in the methods of this disclosure. In many embodiments the adhesive layer comprises an adhesive layer coated on a backing, sheet or film. Articles comprising an adhesive layer coated on a backing, sheet, or film are often referred to as tapes.

In embodiments where the layer comprises an adhesive layer, the adhesive comprises a pressure sensitive adhesive or a heat activated adhesive. These two classes of adhesives are very similar, both being viscoelastic materials. The primary difference between the two classes of adhesives is that pressure sensitive adhesives are permanently and aggressively tacky at room temperature, while heat activated adhesives, as the name implies, require the application of heat to become tacky. A wide variety of pressure sensitive or heat activated adhesives are suitable. Adhesives useful in the present disclosure include tackified natural rubbers, synthetic rubbers, styrene block copolymers, polyvinyl ethers, poly(meth)acrylates, poly-α-olefins, and silicones. The adhesives can also include additives typical of such materials such as tackifying agents, plasticizing agents, fillers, and the like.

In some embodiments the adhesive layer, whether a pressure sensitive adhesive, heat activated adhesive or formed from a pre-adhesive composition, is an electrically conductive adhesive layer. Typically the electrically conductive adhesive layer has added electrically conductive fillers to allow the applied circuit to be grounded and/or further inter-connected in an assembly to make an electrical connection. For example, an electrical circuit transferred to the surface of an adhesive layer with conductive fillers allows the circuit to be grounded and provides for an improved performance for example in EMI shields. The electrical circuit transfer methods can be used to generate a conductive single coated tape, or if electrical circuits are transferred to both major surfaces of a transfer tape, a double coated conductive tape can be formed. Conductive fillers present in the adhesive layer can link the conductivity of the two conductive surfaces. A wide range of electrically conductive fillers are suitable and can contain a variety of compositions including inorganic (such as metal or metal oxide particles or flakes), organometallic (such as metallized polymers), or organic (such as conductive polymers) and can come in a variety of forms including flakes, particles, fibers, nonwoven fiber mats, fabrics, and various blends and mixtures. Suitable examples include nickel flakes or particles, silver plated glass spheres, metalized polymeric or carbon nonwovens or fabrics (such as nickel-copper-nickel plated polyester non-wovens or fabrics). Also suitable are other metals such as silver, gold, etc.

A variety of electrically conductive adhesives are commercially available and are suitable for use as the adhesive layer in the methods and article s of this disclosure. Adhesives that are conductive that could be used to make grounded versions of the invention include conductive adhesive tapes such as 3M ECATT 9707 (Electrically Conductive Adhesive Transfer Tape 9707), 3M ECATT 9750 (Electrically Conductive Adhesive Transfer Tape 9750), the 3M Electrically Conductive Double-Sided Tapes 9711S-80, 9711S-130, 9711S-140, 9711S-150, and 9711S-50, and 3M XYZ-Axis Electrically Conductive Adhesive Transfer Tape 9719.

In some embodiments, the pressure sensitive or heat activated adhesive may be optically clear, meaning that the visible light transmission of the adhesive layer is greater than 90% and the haze is 5% or less, when measured using conventional techniques. Examples of suitable optically clear pressure sensitive adhesives include the optically clear (meth)acrylate-based pressure sensitive adhesive transfer tapes available from 3M Company, such as for example "3M OCA 8171". Transfer tapes are free standing adhesive layers, and are typically supplied between two release liners. The transfer tape can be used as supplied or can be readily converted to a conventional tape by removing one of the release liners and laminating a backing layer, such as a backing film, to one surface.

In some embodiments, the layer comprise a pre-adhesive layer. The pre-adhesive layer is a layer that upon curing forms an adhesive layer. Examples of suitable pre-adhesive layers are UV-curable compositions and thermoset compositions.

In embodiments in which the layer comprises a pre-adhesive layer, the pre-adhesive layer is cured when in contact with the releasing substrate and the thin layer of circuit-forming material. The nature of this curing depends upon the nature of the pre-adhesive layer. If the pre-adhesive layer is UV curable, the pre-adhesive layer is exposed to UV light to effect curing. If the pre-adhesive layer is a thermoset composition, the pre-adhesive layer is exposed to elevated temperatures to effect curing. In some embodiments, the pre-adhesive layer is contacted with a backing layer prior to curing for ease in handling. In some cases the pre-adhesive layer is contacted to the releasing substrate and the thin layer of circuit-forming material with a backing in place, in other embodiments the pre-adhesive layer is formed on the releasing substrate and the thin layer of circuit-forming material and then the backing is contacted to the pre-adhesive layer. An example of a suitable UV curable liquid pre-adhesive composition is "NOA 72" commercially available from Norland.

The method further comprises removing the adhesive layer from the releasing substrate to form an article comprising an adhesive layer with an electrical circuit on its surface. This article may be used in this form. This is particularly true in embodiments in which the article includes a cured pre-adhesive layer. In other embodiments, this article is used to form laminate articles.

Laminate articles are ones which contain a first substrate/ an adhesive layer/and a second substrate. In the laminate articles of this disclosure, the laminates are of the type first substrate/adhesive layer/electrical circuit/second substrate. In these laminate articles, the article formed by removing the adhesive layer from the releasing substrate is of the type first substrate/adhesive layer/electrical circuit, where the first substrate comprises a backing, sheet, or film as described above. This article can then be laminated to a second substrate to form a laminate of the type first substrate/ adhesive layer/electrical circuit/second substrate. In this way the adhesive layer adheres to both the first substrate and the second substrate.

A wide variety of possibilities are suitable for the second substrate. The second substrate can be rigid, semi-rigid or flexible. Examples of rigid substrates include glass plates, relatively thick polymeric plates such as plates of polycarbonate (PC) or polymethylmethacrylate (PMMA), ceramics, metal plates, or the external surface of device. Examples of semi-rigid substrates include relatively thick polymeric films (either monolithic films or multilayer films), and the like. Examples of flexible substrates include tape backings, films (including both optical films and non-optical films), and release liners. The choice of substrate can vary widely depending upon the desired use for the laminate article.

The methods described above can be further understood through the FIGS. 1-4, which correspond to Examples 1-4 of the Examples section below.

FIG. 1 is subdivided into FIGS. 1*a*-1*f*, and shows a cross sectional view of the first methodology described above. FIG. 1*a* shows a cross sectional view of structured thermoplastic sheet 100*a*, which comprises sheet 1 with protrusions 110*a* and depressions 120*a*. The specific dimensions of the protrusions and depressions of the structured thermoplastic sheet 100a are described in Example 1, but in general the protrusions have a much wider cross section than the depressions.

Figure 1B:
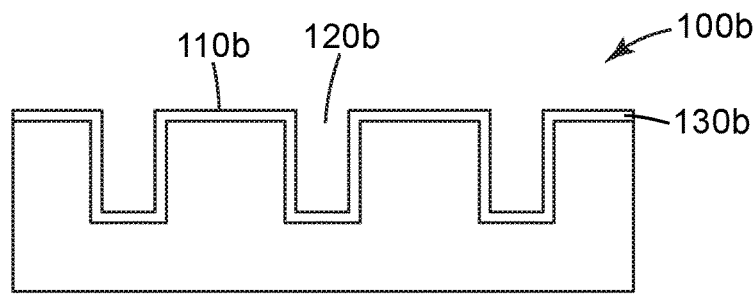

The structured thermoplastic sheet 100a is subjected to Step 1 to generate releasing substrate 100b shown in FIG. 1b, which comprises the structured thermoplastic sheet 100a with a release coating 130b. Step 1 comprises plasma deposition of a release layer as described above. Protrusions 110b and depressions 120b are still present in the releasing substrate 100b.

Figure 1C:
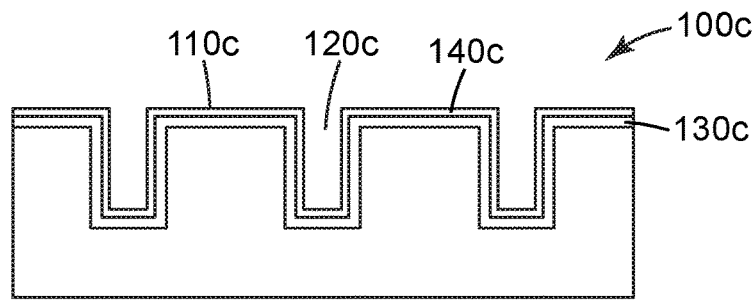

The releasing substrate 100b is subjected to Step 2 to generate a coating of circuit-forming material on the releasing substrate 100b to generate the article 100c shown in FIG. 1c. In this article, release layer 130c is covered by circuit-forming material layer 140c. In many embodiments, circuit-forming material layer 140c comprises a thin layer of metal. While not necessarily shown in the Figure, it is believed that the layer of circuit-forming material is thinner on the sides of depressions 120c than on the bottom of depressions 120c or on the tops of the protrusions 110c. Step 2 can be a variety of different deposition techniques with vacuum deposition being a particularly suitable one.

Figure 1D:
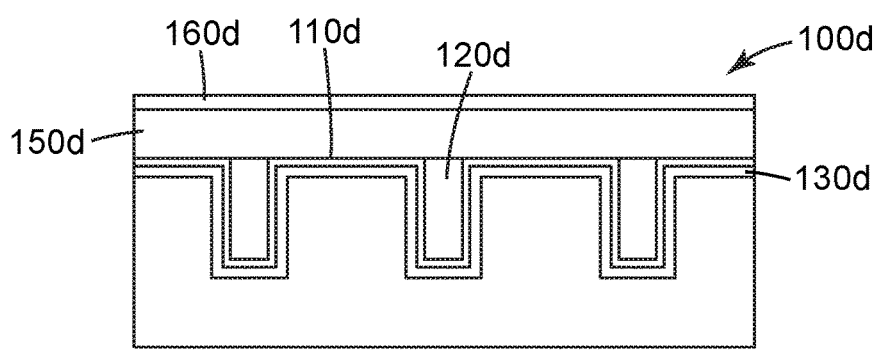

The article 100c is subjected to Step 3 to generate article 100d shown in FIG. 1d. In this article an adhesive layer 150d with optional backing layer 160d is contacted to the layer of circuit-forming material 140d which covers release layer 130d. The adhesive layer 150d only contacts the protrusions 110d and does not extend into the depressions 120d. Step 3 can be a variety of techniques for contacting the adhesive layer 150d to the layer of circuit-forming material 140d, such as lamination.

Figure 1E:
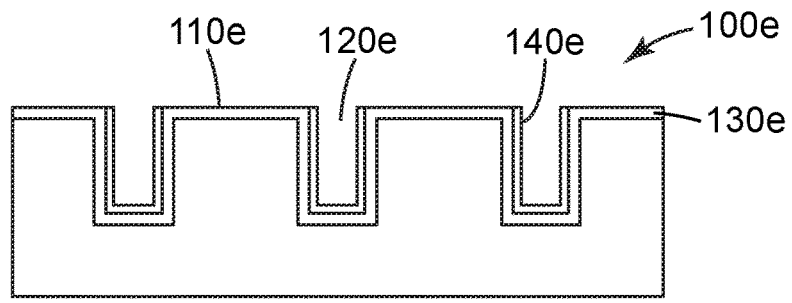
Figure 1F:
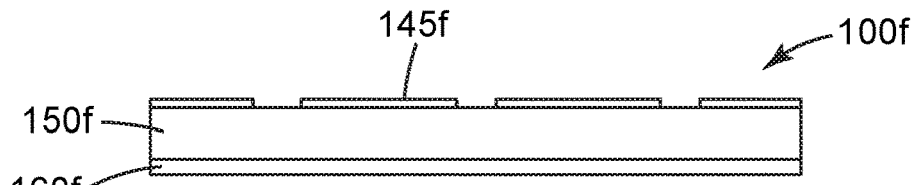

The article 100d is subjected to Step 4, removal of the adhesive layer from the releasing substrate to generate article 100e shown in FIG. 1e and article 100f shown in FIG. 1f. Article 100e is the releasing substrate after the removal of the adhesive layer. Article 100e has release layer 130e, protrusions 110e and depressions 120e. The layer of circuit-forming material 140e is absent from the protrusions 110e and is present only on the sides and bottom of depressions 120e. Article 100f is the adhesive layer after its removal from the releasing substrate. Article 100f has adhesive layer 150f with optional backing layer 160f, and circuit elements 145f which comprise the circuit-forming material removed from the protrusions of the releasing substrate.

Figure 2A:
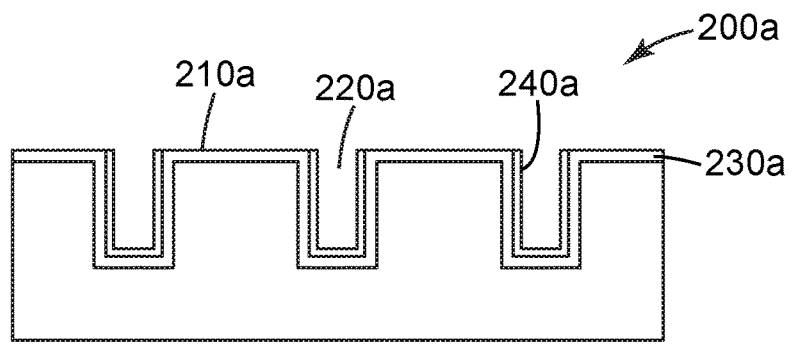
FIG. 2, containing subfigures 2a-2d, is a cross sectional view of an embodiment of a method for preparing another electrical circuit of the present disclosure. The method corresponds with Example 2.

FIG. 2 is subdivided into FIGS. 2a-2d, and shows a cross sectional view of another embodiment of the first methodology described above. In this embodiment, the releasing substrate 100e described above is used to generate a second circuit. FIG. 2a shows a cross sectional view of a releasing substrate 200a which is equivalent to releasing substrate 100e described above. In releasing substrate 200a, contains release layer 230a and has protrusions 210a which are free of circuit-forming material, and depressions 220a which contains circuit-forming material layer 240a on the sides and the bottom of the depressions 220a. Article 200a can be generated via the steps described above for FIG. 1, or the circuit-forming material layer present on protrusions 210a can be removed by other means such as wiping, vacuum removal, and the like.

Article 200a is subjected to Step 5 to generate article 200b, the addition of a pre-adhesive material followed by curing to form adhesive layer 270b with optional backing layer 280b such that adhesive layer 270b not only contacts the releasing layer 230b on the protrusions 210b, but also contains the circuit-forming material layer 240b located on the sides and bottom of depressions 210b.

Figure 2B:
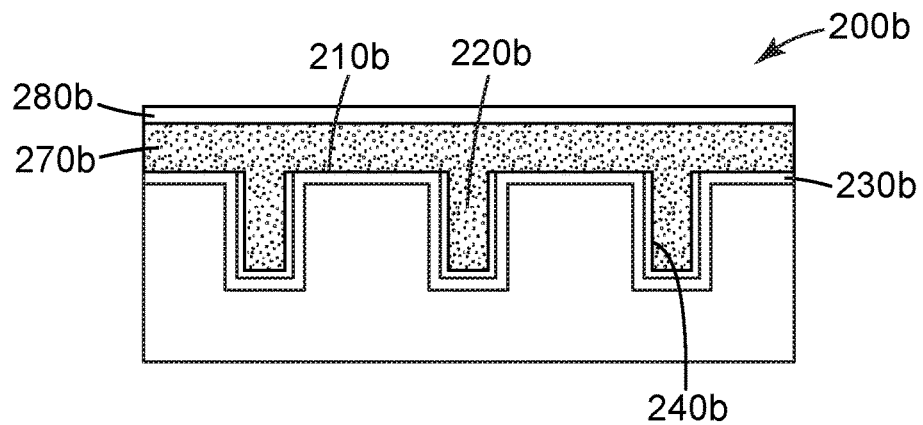
Figure 2C:
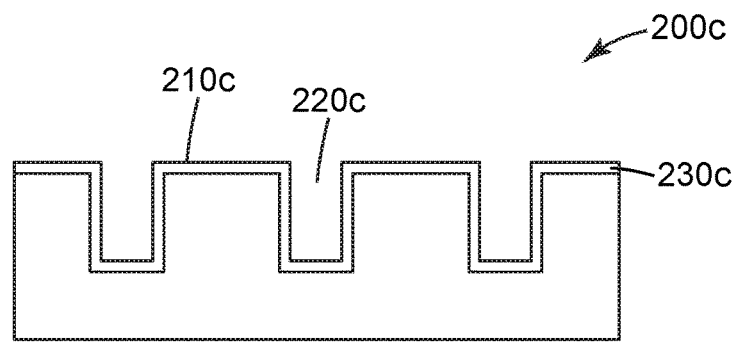
Figure 2D:
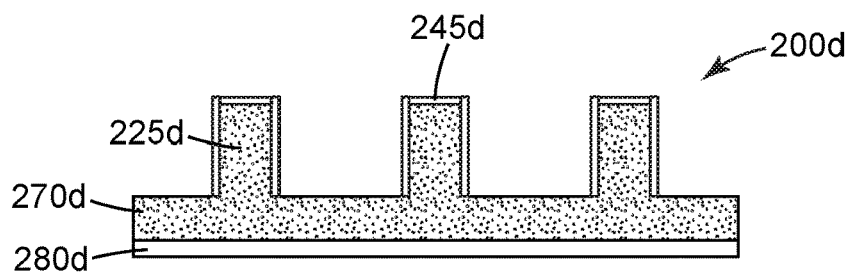

Article 200b is subjected to Step 6 to generate article 200c in FIG. 2c, and article 200d in FIG. 2d. Article 200c is the releasing substrate after the removal of the adhesive layer. Article 200c has release layer 230c, protrusions 210c and depressions 220c. All of the circuit-forming material is absent from both the protrusions 210c and the depressions 220c. Article 200d is the adhesive layer after its removal from the releasing substrate. Article 200d has adhesive layer 270d with optional backing layer 280d, and circuit elements 245d which comprise the circuit-forming material removed from the depressions of the releasing substrate, and are located on adhesive layer structures 225d which protrude above the surface of the adhesive layer 270d, and correspond to the size and shape of the depressions 220c of the releasing substrate in article 200c.

Figure 3A:
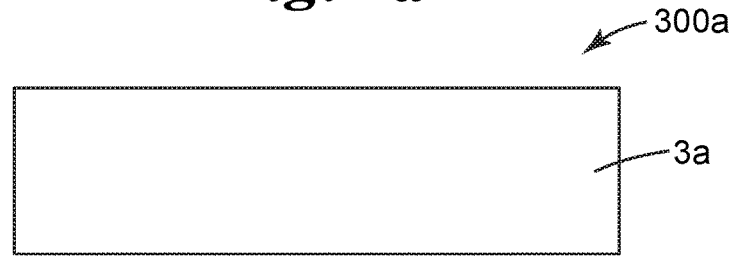
FIG. 3, containing subfigures 3a-3i, is a cross sectional view of an embodiment of a method for preparing yet another electrical circuit of the present disclosure. The method corresponds with Example 3.

FIG. 3 is subdivided into FIGS. 3a-3i, and shows a cross sectional view of an embodiment of the second methodology described above. FIG. 3a shows a cross sectional view of unstructured thermoplastic sheet 300a, which comprises sheet 3a.

Figure 3B:

The unstructured thermoplastic sheet 300a is subjected to Step 7 to generate releasing substrate 300b shown in FIG. 3b, which comprises the unstructured thermoplastic sheet 3b with a release coating 330b. Step 7 comprises plasma deposition of a release layer as described above.

Figure 3C:
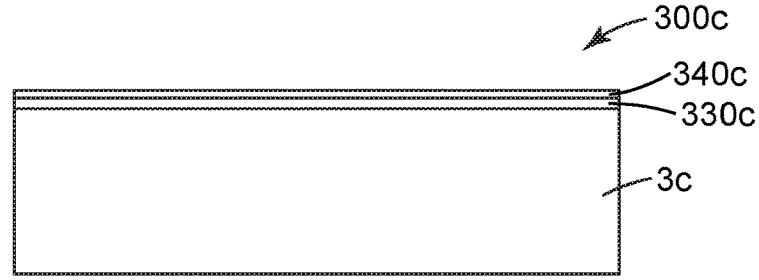

The releasing substrate 300b is subjected to Step 8 to generate a coating of circuit-forming material on the releasing substrate 300b to generate the article 300c shown in FIG. 3c. In this article, release layer 330c is covered by circuit-forming material layer 340c. In many embodiments, circuit-forming material layer 340c comprises a thin layer of metal. Step 8 can be a variety of different deposition techniques with vacuum deposition being a particularly suitable one.

Figure 3D:
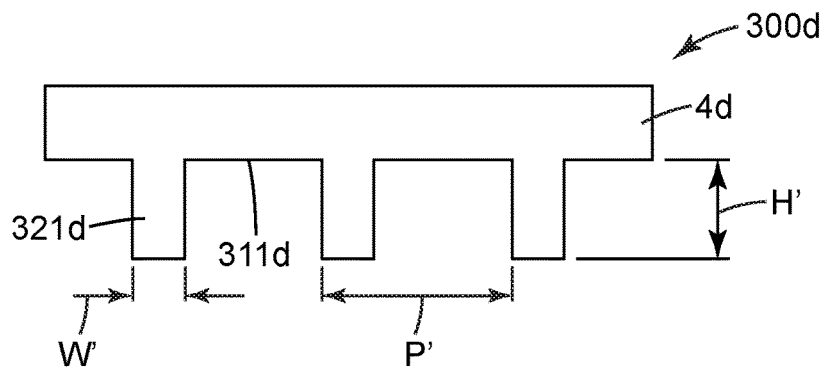

The article 300c is subjected to Step 9 which is providing article 300d shown in FIG. 3d. Article 300d comprises a structuring tool base 4d with protrusions 321d and depressions 311d. The protrusions 321d designed to form depressions in the article to which the structuring tool 300d is embossed, and the depressions 311d are designed to form protrusions in the article to which the structuring tool 300d is embossed. The specific dimensions of the protrusions and depressions of the structured tool 300d are described in Example 3, but in general the protrusions have a much narrower cross section than the depressions. The structuring tool may be formed from a wide array of materials including metals and polymeric materials as is well understood in the structuring art.

Figure 3E:
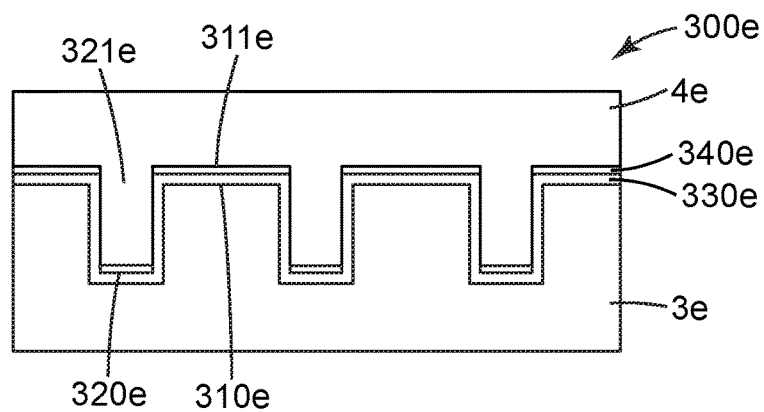

The articles 300c and 300d are subjected to Step 10, embossing of the tool 300d to article 300c to form article 300e as shown in FIG. 3e. This embossing is carried out through the use of pressure and may optionally include heat. Article 300e includes thermoplastic sheet 3e with a release coating 330e with formed structures of: depressions 320e formed by the indentation of protrusions 321e protruding from the base 4e of structuring tool 300d; and protrusions 310e formed from depression 311e of the base 4e or structuring tool 300d.

Figure 3F:
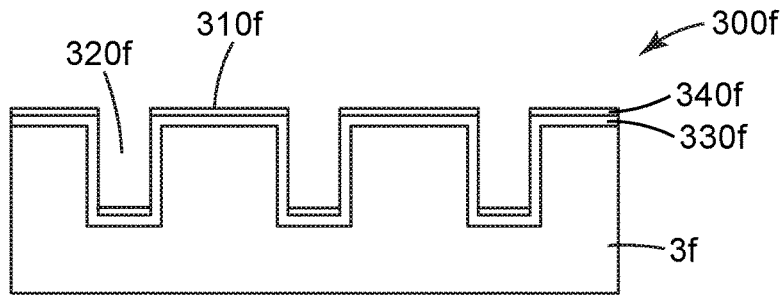

The article 300e is subjected to Step 11, which is removal of the embossing tool 300d from releasing substrate, to regenerate the embossing tool 300d (not shown) and the article 300f shown in FIG. 3f. Article 300f has release layer 330f and circuit-forming material layer 340f and is similar to article 100c described above, except that whereas in article 100c the circuit-forming material layer is essentially continuous, in article 300f, the circuit-forming material layer 340f is present on the tops of protrusions 310f and on the bottoms of depressions 320f, but the circuit-forming material layer 340f is not present on the sides of depressions 320f. This is an artifact of the embossing process described above which causes a break in the circuit-forming material layer.

Figure 3G:
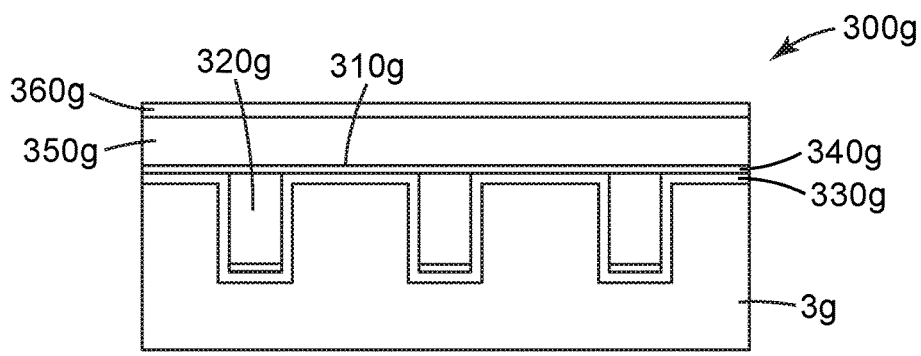

The article 300f is subjected to Step 12 to generate article 300g shown in FIG. 3g. In this article an adhesive layer 350d with optional backing layer 360d is contacted to the layer of circuit-forming material 340d which covers release layer 330d. The adhesive layer 350d only contacts the protrusions 310d and does not extend into the depressions 320d. Step 12 can be a variety of techniques for contacting the adhesive layer 350d to the layer of circuit-forming material 340d, such as lamination.

Figure 3H:
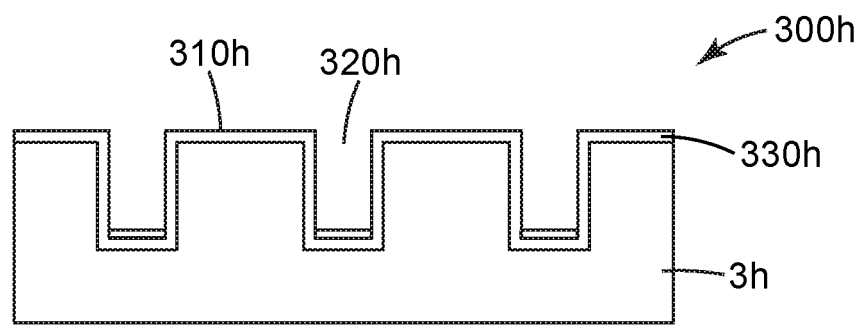
Figure 3I:
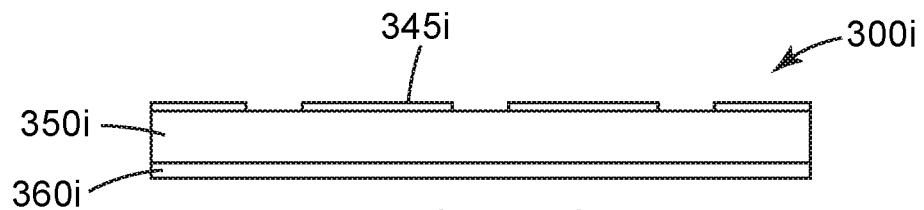

The article 300g is subjected to Step 13, removal of the adhesive layer from the releasing substrate to generate article 300h shown in FIG. 3h and article 300i shown in FIG. 3i. Article 300h is the releasing substrate after the removal of the adhesive layer. Article 300h has release layer 330h, protrusions 310h and depressions 320h. The layer of circuit-forming material 340h is absent from the protrusions 310h and is present only on the bottom of depressions 320h. Article 300i is the adhesive layer after its removal from the releasing substrate. Article 300i has adhesive layer 350i with optional backing layer 360i, and circuit elements 345i which comprise the circuit-forming material removed from the protrusions of the releasing substrate.

Figure 4A:
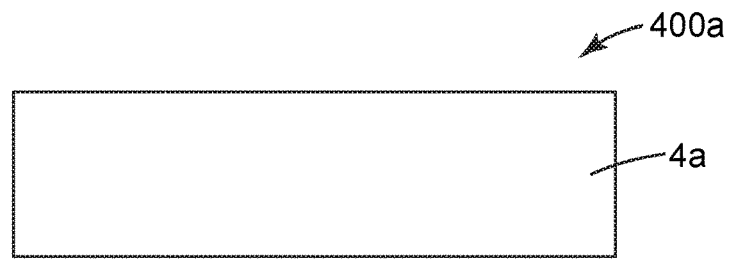
FIG. 4, containing subfigures 4a-4i, is a cross sectional view of an embodiment of a method for preparing yet another electrical circuit of the present disclosure. The method corresponds with Example 4.

FIG. 4 is subdivided into FIGS. 4a-4i, and shows a cross sectional view of an embodiment of the third methodology described above. FIG. 4a shows a cross sectional view of unstructured thermoplastic sheet 400a, which comprises sheet 4a.

Figure 4B:
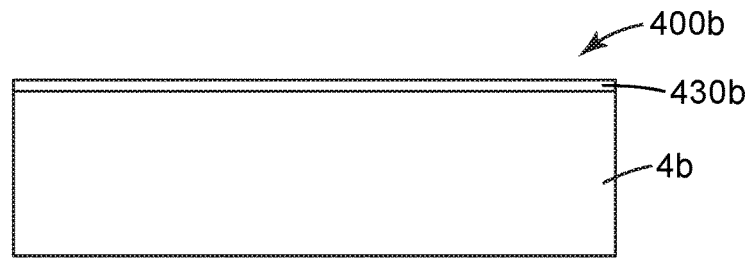

The unstructured thermoplastic sheet 400a is subjected to Step 14 to generate releasing substrate 400b shown in FIG. 4b, which comprises the unstructured thermoplastic sheet 4b with a release coating 430b. Step 14 comprises plasma deposition of a fluorinated release layer as described above.

Figure 4C:
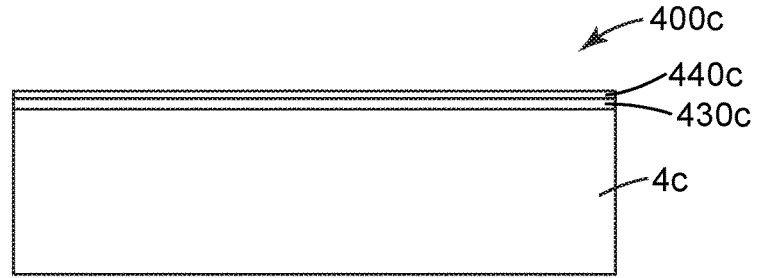

The releasing substrate 400b is subjected to Step 15 to generate a coating of circuit-forming material on the releasing substrate 400b to generate the article 400c shown in FIG. 4c. In this article, release layer 430c is covered by circuit-forming material layer 440c. In many embodiments, circuit-forming material layer 440c comprises a thin layer of metal, typically a very thin layer of metal. Step 15 can be a variety of different deposition techniques with vacuum deposition being a particularly suitable one.

Figure 4D:
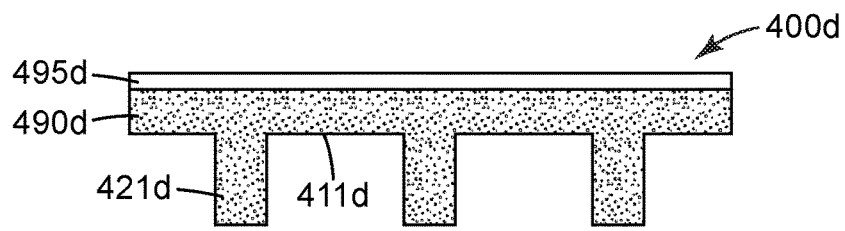

The article 400c is subjected to Step 16 which is providing structured adhesive article 400d shown in FIG. 4d. Article 400d comprises an adhesive article that has been structured by contacting the adhesive layer to a structuring tool. While the adhesive layer can be directly structured by contacting the adhesive layer to a structuring tool, typically this structuring is done when the adhesive layer is covered by a release liner. The adhesive article 400d has adhesive layer 490d with protrusions 421d and depressions 411d, and optional backing layer 495d. The specific dimensions of the protrusions and depressions of the adhesive article 400d are described in the Examples section, but in general the protrusions have a much wider cross section than the depressions.

Figure 4E:
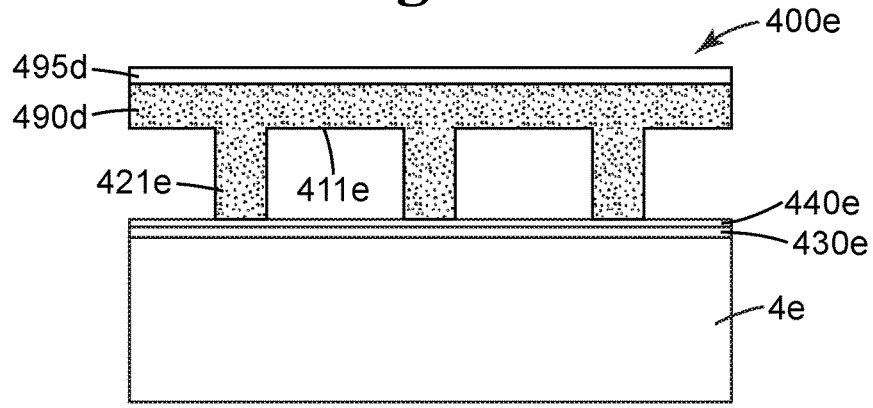

The articles 400c and 400d are subjected to Step 17, contacting structured adhesive article 400d to article 400c to form article 400e as shown in FIG. 4e. Article 400e includes thermoplastic sheet 4e with a release coating 430e and circuit-forming material 440e. The protrusions 421e protruding from the base of adhesive layer 490e contact circuit-forming material layer 440e, but depressions 411e of adhesive layer 490d do not contact circuit-forming material layer 440e. Optional backing layer 495e is also shown attacking to adhesive layer 490d.

Figure 4F:
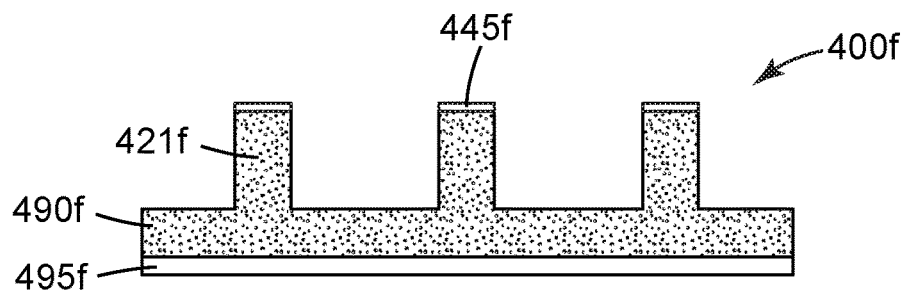
Figure 4G:
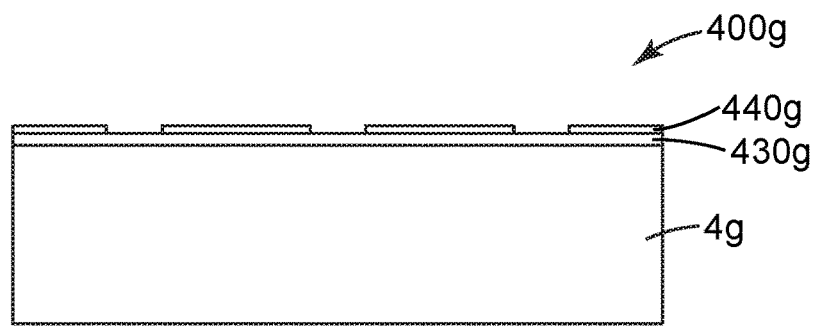
Figure 4H:
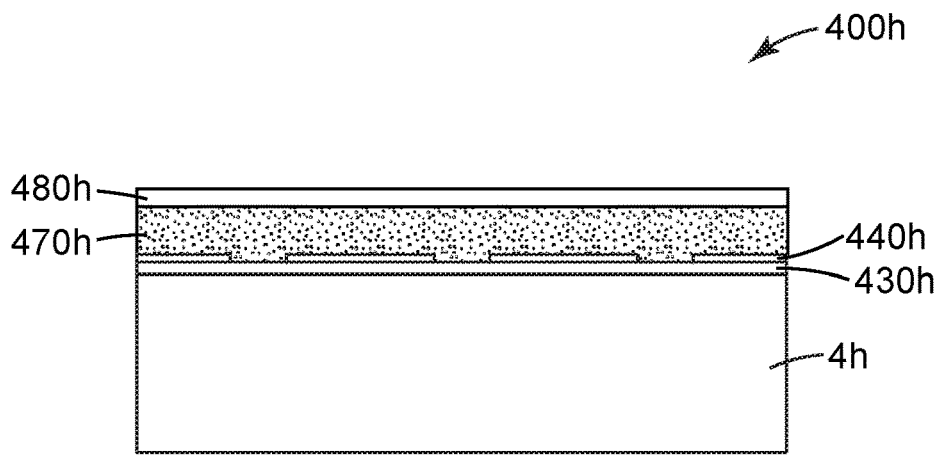

The article 400e is subjected to Step 18, which is removal of the adhesive article 400d from the releasing substrate, to generate article 400f shown in FIG. 4f and the article 400g shown in FIG. 4g. Article 400f is the adhesive layer after its removal from the releasing substrate. Article 400f has adhesive layer 490f with optional backing layer 495f, and circuit elements 445f which comprise the circuit-forming material removed from the releasing substrate, and are located on adhesive layer structures 421f which protrude above the base of the adhesive layer 490f. Article 400g has thermoplastic sheet 4g with a release layer 430g and discontinuous circuit-forming material layer 440g.

The article 400g is subjected to Step 19 to generate article 400h, the addition of a pre-adhesive material followed by curing to form adhesive layer 470h with optional backing layer 480h such that adhesive layer 470h not only contacts the releasing layer 430h, but also contacts the protrusions of the discontinuous circuit-forming material layer 440h.

Figure 4I:
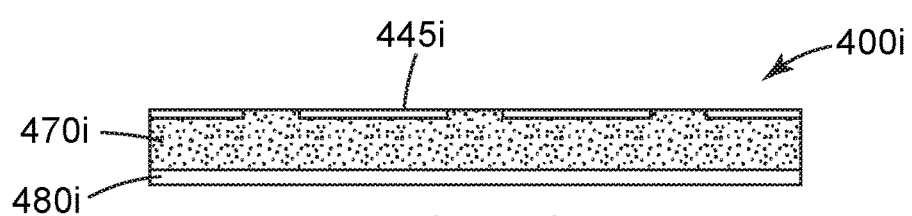

Article 400h is subjected to Step 20 to regenerate the releasing substrate of FIG. 4b (not shown), and article 400i in FIG. 4i. Article 400i is the adhesive layer after its removal from the releasing substrate. Article 400i has adhesive layer 470i with optional backing layer 480i, and circuit elements 445i which comprise the circuit-forming material removed from the releasing substrate.

Also disclosed are multilayer articles, prepared by the methods described above. The multilayer articles comprise an adhesive layer comprising a first major surface and a second major surface, an electrical circuit in contact with at least a portion of the first major surface of the adhesive layer, and a releasing substrate with a first major surface and a second major surface, where the second major surface comprises a fluorinated release surface, and where at least a portion of the second major surface is in contact with the electrical circuit. Such multilayer articles are the intermediate articles shown, for example as article 100d shown in FIG. 1d, article 200b shown in FIG. 2b, article 300g shown in FIG. 3g, and article 400h shown in FIG. 4h.

As discussed above, a variety of releasing substrates are suitable. Particularly suitable releasing substrates are those with a fluorinated release surface prepared by plasma deposition. The releasing substrate has a structured and/or patterned release surface, as described in detail above. The structured and/or patterned release surface is typically prepared by embossing, either prior to coating with the release layer or after the coating with the release layer and circuit-forming material layer.

The electrical circuit comprises, an RFID antenna, an LED circuit, an EMI shield, a wearable electronic sensor, or a touch screen circuit.

The multilayer article may include additional layers. In some embodiments, the adhesive layer comprises an adhesive layer coated on a backing, sheet or film. In other embodiments, the adhesive layer is formed from a pre-adhesive material that has been coated and cured. In these embodiments, the cured pre-adhesive material layer may be coated onto a backing, sheet or film, or the cured pre-adhesive material layer may be free standing layer.

Also disclosed are multilayer articles in which the releasing substrate has been removed to expose the electronic circuit and the adhesive layer. In these articles, as stated above, the adhesive layer can be coated on a backing, sheet or film, or the adhesive layer can be cured pre-adhesive material layer that is a free standing layer.

As was stated above, the multilayer articles in which the releasing substrate has been removed to expose the electronic circuit and the adhesive layer can be used as is, or the adhesive layer can be contacted to a second substrate to form a multilayer laminate article. A wide variety of possibilities are suitable for the second substrate. The second substrate can be rigid, semi-rigid or flexible. Examples of rigid substrates include glass plates, relatively thick polymeric plates such as plates of polycarbonate (PC) or polymethylmethacrylate (PMMA), ceramics, metal plates, or the external surface of device. Examples of semi-rigid substrates include relatively thick polymeric films (either monolithic films or multilayer films), and the like. Examples of flexible substrates include tape backings, films (including both optical films and non-optical films), and release liners. The choice of substrate can vary widely depending upon the desired use for the laminate article.

The present disclosure includes the following embodiments:

Among the embodiments are methods of preparing electrical circuits on a surface.

Embodiment 1 includes a method of preparing an electrical circuit on a surface comprising: providing a structured releasing substrate comprising a series of protrusions and depressions on the surface of the releasing substrate, and having a fluorinated release layer on the surface of the releasing substrate, wherein the fluorinated release layer comprises a release surface prepared by plasma deposition; preparing a layer of circuit-forming material on the release layer on the surface of the structured releasing substrate; providing an adhesive layer; contacting the adhesive layer to the circuit-forming material on protrusions of the structured releasing substrate; and removing the adhesive layer from the surface of the structured releasing substrate, such that at least a portion of the circuit-forming material on the protrusions of the structured releasing substrate at least partially adheres to the surface of the adhesive layer upon removal to form an adhesive surface with an electrical circuit on it.

Embodiment 2 is the method of embodiment 1, wherein the series of protrusions and depressions on the surface of the releasing substrate comprise a pattern of hemispheres, prisms, pyramids, ellipses, grooves, or channels.

Embodiment 3 is the method of embodiment 1 or 2, wherein the circuit-forming layer comprises a layer of metal.

Embodiment 4 is the method of embodiment 3, wherein the metal comprises copper, chromium, aluminum, nickel, gold, silver, tungsten or combinations thereof.

Embodiment 5 is the method of embodiment 1 or 2, wherein the circuit-forming layer comprises a layer of conductive or semiconductive metal oxide.

Embodiment 6 is the method of embodiment 5, wherein the conductive or semiconductive metal oxide comprises binary metal oxides comprising zinc oxide, titania, tin oxide, alumina, indium oxide, magnesia, zirconia, barium oxide, molybdenum trioxide, tungsten trioxide, and vanadium pentoxide; or doped conductive metal oxides comprising Sb-doped tin oxide, Al-doped zinc oxide, In-doped zinc oxide, In-doped tin oxide, and Sb-doped zinc oxide.

Embodiment 7 is the method of any of embodiments 1-6, wherein the circuit-forming layer has a thickness of from 100 nanometers to 1 micrometer.

Embodiment 8 is the method of any of embodiments 1-7, wherein the protrusions of the structured release layer comprise an average cross sectional width of from 1.0 to 3.0 millimeters.

Embodiment 9 is the method of any of embodiments 1-8, wherein the electrical circuit on the surface of the adhesive layer is in a pattern that corresponds with the pattern of protrusions of the releasing substrate.

Embodiment 10 is the method of any of embodiments 1-9, wherein the electrical circuit on the surface of the adhesive layer comprises, an RFID antenna, an LED circuit, an EMI shield, a wearable electronic sensor, or a touch screen circuit.

Embodiment 11 is the method of any of embodiments 1-10, further comprising contacting the adhesive surface with an electrical circuit on it to the surface of a second substrate to form a laminate construction.

Embodiment 12 is the method of embodiment 11, wherein the second substrate comprises a rigid, a semi-rigid or a flexible substrate.

Embodiment 13 is the method of embodiment 12, wherein the second substrate comprises a rigid substrate selected from glass plates, polymeric plates of polycarbonate (PC) or polymethylmethacrylate (PMMA), ceramics, metal plates, or the external surface of device.

Embodiment 14 is the method of embodiment 12, wherein the second substrate comprises a semi-rigid substrate selected from monolithic polymeric films, or multilayer polymeric films.

Embodiment 15 is the method of embodiment 12, wherein the second substrate comprises a flexible substrate selected from tape backings, optical films, non-optical films, and release liners.

Embodiment 16 is the method of any of embodiments 1-15, wherein the adhesive layer comprises an optically clear adhesive layer.

Embodiment 17 is the method of any of embodiments 1-16, wherein the adhesive layer comprises a (meth)acrylate-based pressure sensitive adhesive or a silicone-based pressure sensitive adhesive.

Embodiment 18 is the method of any of embodiments 1-17, wherein the adhesive layer comprises an electrically conductive adhesive layer.

Embodiment 19 includes a method of preparing an electrical circuit on a surface comprising: providing a structured releasing substrate comprising a series of protrusions and depressions on the surface of the releasing substrate, and having a fluorinated release layer on the surface of the releasing substrate, wherein the fluorinated release layer comprises a release surface prepared by plasma deposition; preparing a layer of circuit-forming material on the release layer on the surface of the structured releasing substrate; removing the circuit-forming material from the protrusions of the releasing substrate; providing an adhesive or a pre-adhesive layer; contacting the adhesive layer or the pre-adhesive layer to the circuit-forming material in the depressions of the structured releasing substrate; if the adhesive layer is a pre-adhesive layer, curing the pre-adhesive layer to form an adhesive layer; and removing the adhesive layer from the surface of the structured releasing substrate, such that at least a portion of the circuit-forming material in the depressions of the structured releasing substrate at least partially adheres to the surface of the adhesive layer upon removal to form an adhesive surface with an electrical circuit on it.

Embodiment 20 is the method of embodiment 19, wherein the series of protrusions and depressions on the surface of the releasing substrate comprise a pattern of hemispheres, prisms, pyramids, ellipses, grooves, or channels.

Embodiment 21 is the method of embodiment 19 or 20, wherein the circuit-forming layer comprises a layer of metal.

Embodiment 22 is the method of embodiment 21, wherein the metal comprises copper, chromium, aluminum, nickel, gold, silver, tungsten or combinations thereof.

Embodiment 23 is the method of embodiment 19 or 20, wherein the circuit-forming layer comprises a layer of conductive or semiconductive metal oxide.

Embodiment 24 is the method of embodiment 23, wherein the conductive or semiconductive metal oxide comprises binary metal oxides comprising zinc oxide, titania, tin oxide, alumina, indium oxide, magnesia, zirconia, barium oxide, molybdenum trioxide, tungsten trioxide, and vanadium pentoxide; or doped conductive metal oxides comprising Sb-doped tin oxide, Al-doped zinc oxide, In-doped zinc oxide, In-doped tin oxide, and Sb-doped zinc oxide.

Embodiment 25 is the method of any of embodiments 19-24, wherein the circuit-forming layer has a thickness of from 100 nanometers to 1 micrometer.

Embodiment 26 is the method of any of embodiments 19-25, wherein the protrusions of the structured release layer comprise an average cross sectional width of from 1.0 to 3.0 millimeters.

Embodiment 27 is the method of any of embodiments 19-26, wherein the electrical circuit on the surface of the adhesive layer is in a pattern that corresponds with the pattern of depressions of the releasing substrate.

Embodiment 28 is the method of any of embodiments 19-27, wherein the electrical circuit on the surface of the adhesive layer comprises, an RFID antenna, an LED circuit, an EMI shield, a wearable electronic sensor, or a touch screen circuit.

Embodiment 29 is the method of any of embodiments 19-28, further comprising contacting the adhesive surface with an electrical circuit on it to the surface of a second substrate to form a laminate construction.

Embodiment 30 is the method of embodiment 29, wherein the second substrate comprises a rigid, a semi-rigid or a flexible substrate.

Embodiment 31 is the method of embodiment 30, wherein the second substrate comprises a rigid substrate selected from glass plates, polymeric plates of polycarbonate (PC) or polymethylmethacrylate (PMMA), ceramics, metal plates, or the external surface of device.

Embodiment 32 is the method of embodiment 30, wherein the second substrate comprises a semi-rigid substrate selected from monolithic polymeric films, or multilayer polymeric films.

Embodiment 33 is the method of embodiment 30, wherein the second substrate comprises a flexible substrate selected from tape backings, optical films, non-optical films, and release liners.

Embodiment 34 is the method of any of embodiments 19-33, wherein removing the circuit-forming material from the protrusions of the releasing substrate comprises adhesive transfer, wiping, or vacuum removal.

Embodiment 35 is the method of any of embodiments 19-34, wherein the pre-adhesive layer comprises a UV-curable composition or a thermoset composition.

Embodiment 36 is the method of any of embodiments 19-35, wherein the pre-adhesive composition comprises an electrically conductive pre-adhesive composition.

Embodiment 37 is the method of any of embodiments 19-36, further comprising contacting a backing layer to the adhesive or pre-adhesive layer.

Embodiment 38 includes a method of preparing an electrical circuit on a surface comprising: providing an unstructured releasing substrate having a fluorinated release layer on the surface of the releasing substrate wherein the fluorinated release layer comprises a release surface prepared by plasma deposition; preparing a layer of circuit-forming material on the release layer on the surface of the releasing substrate; providing an embossing tool comprising a surface with protrusions and depressions; embossing the embossing tool against the layer of circuit-forming material on the release layer on the surface of the releasing substrate with pressure to prepare an embossed surface in the layer of circuit-forming material on the release layer on the surface of the releasing substrate; removing the embossing tool from the layer of circuit-forming material on the release layer on the surface of the releasing substrate; providing an adhesive layer; contacting the adhesive layer to the circuit-forming material on the embossed protrusions of the embossed surface of the releasing substrate; and removing the adhesive layer from the embossed surface of the releasing substrate, such that at least a portion of the circuit-forming material on the embossed protrusions of the releasing substrate at least partially adheres to the surface of the adhesive layer upon removal to form an adhesive surface with an electrical circuit on it.

Embodiment 39 is the method of embodiment 38, wherein the series of protrusions and depressions in the embossed surface in the layer of circuit-forming material on the release layer on the surface of the releasing substrate comprise a pattern of hemispheres, prisms, pyramids, ellipses, grooves, or channels.

Embodiment 40 is the method of embodiment 38 or 39, wherein the circuit-forming layer comprises a layer of metal.

Embodiment 41 is the method of embodiment 40, wherein the metal comprises copper, chromium, aluminum, nickel, gold, silver, tungsten or combinations thereof.

Embodiment 42 is the method of embodiment 38 or 39, wherein the circuit-forming layer comprises a layer of conductive or semiconductive metal oxide.

Embodiment 43 is the method of embodiment 42, wherein the conductive or semiconductive metal oxide comprises binary metal oxides comprising zinc oxide, titania, tin oxide, alumina, indium oxide, magnesia, zirconia, barium oxide, molybdenum trioxide, tungsten trioxide, and vanadium pentoxide; or doped conductive metal oxides comprising Sb-doped tin oxide, Al-doped zinc oxide, In-doped zinc oxide, In-doped tin oxide, and Sb-doped zinc oxide.

Embodiment 44 is the method of any of embodiments 38-43, wherein the circuit-forming layer has a thickness of from 100 nanometers to 1 micrometer.

Embodiment 45 is the method of any of embodiments 38-44, wherein the protrusions in the layer of circuit-forming material on the release layer on the surface of the releasing substrate comprise an average cross sectional width of from 1.0 to 3.0 millimeters.

Embodiment 46 is the method of any of embodiments 38-45, wherein the electrical circuit on the surface of the adhesive layer is in a pattern that corresponds with the pattern of protrusions of the releasing substrate.

Embodiment 47 is the method of any of embodiments 38-46, wherein the electrical circuit on the surface of the adhesive layer comprises, an RFID antenna, an LED circuit, an EMI shield, a wearable electronic sensor, or a touch screen circuit.

Embodiment 48 is the method of any of embodiments 38-47, further comprising contacting the adhesive surface with an electrical circuit on it to the surface of a second substrate to form a laminate construction.

Embodiment 49 is the method of embodiment 48, wherein the second substrate comprises a rigid, a semi-rigid or a flexible substrate.

Embodiment 50 is the method of embodiment 49, wherein the second substrate comprises a rigid substrate selected from glass plates, polymeric plates of polycarbonate (PC) or polymethylmethacrylate (PMMA), ceramics, metal plates, or the external surface of device.

Embodiment 51 is the method of embodiment 49, wherein the second substrate comprises a semi-rigid substrate selected from monolithic polymeric films, or multilayer polymeric films.

Embodiment 52 is the method of embodiment 49, wherein the second substrate comprises a flexible substrate selected from tape backings, optical films, non-optical films, and release liners.

Embodiment 53 is the method of any of embodiments 38-52, wherein the adhesive layer comprises an optically clear adhesive layer.

Embodiment 54 is the method of any of embodiments 38-53, wherein the adhesive layer comprises a (meth)acrylate-based pressure sensitive adhesive or silicone-based pressure sensitive adhesive.

Embodiment 55 is the method of any of embodiments 38-54, wherein the adhesive layer comprises a conductive adhesive layer.

Embodiment 56 is the method of any of embodiments 38-55, further comprising providing the releasing substrate with an embossed surface and circuit-forming material in the depressions of the embossed surface; providing an adhesive or a pre-adhesive layer; contacting the adhesive layer or the pre-adhesive layer to the circuit-forming material in the depressions of the embossed releasing substrate; if the adhesive layer is a pre-adhesive layer, curing the pre-adhesive layer to form an adhesive layer; and removing the adhesive layer from the surface of the structured releasing substrate, such that at least a portion of the circuit-forming material in the depressions of the structured releasing substrate at least partially adheres to the surface of the adhesive layer upon removal to form an adhesive surface with an electrical circuit on it.

Embodiment 57 includes a method of preparing an electrical circuit on a surface comprising: providing an unstructured releasing substrate having a fluorinated release layer on the surface of the releasing substrate, wherein the fluorinated release layer comprises a release surface prepared by plasma deposition; preparing a layer of circuit-forming material on the release layer on the surface of the releasing substrate; providing an structured adhesive layer comprising a surface with protrusions and depressions; contacted the structured adhesive layer against the layer of circuit-forming material on the release layer on the surface of the releasing substrate such that only the protrusions of the structured adhesive layer contact the layer of circuit-forming material; removing the adhesive layer from the releasing substrate, such that at least a portion of the circuit-forming material on the protrusions of the structured adhesive layer at least partially adheres to the surface of the adhesive layer upon removal to form an adhesive surface with an electrical circuit on it.

Embodiment 58 is the method of embodiment 57, wherein the series of protrusions and depressions on the surface of the adhesive layer comprise a pattern of hemispheres, prisms, pyramids, ellipses, grooves, or channels.

Embodiment 59 is the method of embodiment 57 or 58, wherein the circuit-forming layer comprises a layer of metal.

Embodiment 60 is the method of embodiment 59, wherein the metal comprises copper, chromium, aluminum, nickel, gold, silver, tungsten or combinations thereof.

Embodiment 61 is the method of embodiment 57 or 58, wherein the circuit-forming layer comprises a layer of conductive or semiconductive metal oxide.

Embodiment 62 is the method of embodiment 61, wherein the conductive or semiconductive metal oxide comprises binary metal oxides comprising zinc oxide, titania, tin oxide, alumina, indium oxide, magnesia, zirconia, barium oxide, molybdenum trioxide, tungsten trioxide, and vanadium pentoxide; or doped conductive metal oxides comprising Sb-doped tin oxide, Al-doped zinc oxide, In-doped zinc oxide, In-doped tin oxide, and Sb-doped zinc oxide.

Embodiment 63 is the method of any of embodiments 57-62, wherein the circuit-forming layer has a thickness of less than 100 nanometers.

Embodiment 64 is the method of any of embodiments 57-62, wherein the circuit-forming layer has a thickness of from 50 to 100 nanometers.

Embodiment 65 is the method of any of embodiments 57-64, wherein the protrusions of the adhesive layer comprise an average cross sectional width of from 1.0 to 3.0 millimeters.

Embodiment 66 is the method of any of embodiments 57-65, wherein the electrical circuit on the surface of the adhesive layer is in a pattern that corresponds with the pattern of protrusions of the releasing substrate.

Embodiment 67 is the method of any of embodiments 57-66, wherein the electrical circuit on the surface of the adhesive layer comprises, an RFID antenna, an LED circuit, an EMI shield, a wearable electronic sensor, or a touch screen circuit.

Embodiment 68 is the method of any of embodiments 57-67, further comprising contacting the adhesive surface with an electrical circuit on it to the surface of a second substrate to form a laminate construction.

Embodiment 69 is the method of embodiment 68, wherein the second substrate comprises a rigid, a semi-rigid or a flexible substrate.

Embodiment 70 is the method of embodiment 69, wherein the second substrate comprises a rigid substrate selected from glass plates, polymeric plates of polycarbonate (PC) or polymethylmethacrylate (PMMA), ceramics, metal plates, or the external surface of device.

Embodiment 71 is the method of embodiment 69, wherein the second substrate comprises a semi-rigid substrate selected from monolithic polymeric films, or multilayer polymeric films.

Embodiment 72 is the method of embodiment 69, wherein the second substrate comprises a flexible substrate selected from tape backings, optical films, non-optical films, and release liners.

Embodiment 73 is the method of any of embodiments 57-72, wherein the adhesive layer comprises an optically clear adhesive layer.

Embodiment 74 is the method of any of embodiments 57-73, wherein the adhesive layer comprises a (meth)acrylate-based pressure sensitive adhesive or silicone-based pressure sensitive adhesive.

Embodiment 75 is the method of any of embodiments 57-74, wherein the adhesive layer comprises a conductive adhesive layer.

Embodiment 76 is the method of any of embodiments 57-75, further comprising: contacting a curable liquid adhesive to the surface of the releasing substrate from which portions of circuit-forming material have been removed; curing the liquid adhesive to form an adhesive layer; and removing the adhesive layer such that at least a portion of the circuit-forming material on the releasing substrate at least partially adheres to the surface of the adhesive layer upon removal to form an adhesive surface with an electrical circuit on it.

Embodiment 77 is the method of embodiment 76, wherein the electrical circuit on the surface of the adhesive layer comprises, an RFID antenna, an LED circuit, an EMI shield, a wearable electronic sensor, or a touch screen circuit.

Embodiment 78 is the method of any of embodiments 76-77, further comprising contacting the adhesive surface with an electrical circuit on it to the surface of a second substrate to form a laminate construction.

Embodiment 79 is the method of embodiment 78, wherein the second substrate comprises a rigid, a semi-rigid or a flexible substrate.

Embodiment 80 is the method of embodiment 79, wherein the second substrate comprises a rigid substrate selected from glass plates, polymeric plates of polycarbonate (PC) or polymethylmethacrylate (PMMA), ceramics, metal plates, or the external surface of device.

Embodiment 81 is the method of embodiment 79, wherein the second substrate comprises a semi-rigid substrate selected from monolithic polymeric films, or multilayer polymeric films.

Embodiment 82 is the method of embodiment 79, wherein the second substrate comprises a flexible substrate selected from tape backings, optical films, non-optical films, and release liners.

Embodiment 83 is the method of any of embodiments 76-82, wherein the pre-adhesive layer comprises a UV-curable composition or a thermoset composition.

Embodiment 84 is the method of any of embodiments 76-83, wherein the pre-adhesive layer comprises an electrically conductive pre-adhesive composition.

Embodiment 85 is the method of any of embodiments 76-84, further comprising contacting a backing layer to the adhesive or pre-adhesive layer.

Also disclosed are multilayer articles.

Embodiment 86 includes a multilayer article comprising: an adhesive layer comprising a first major surface and a second major surface; an electrical circuit in contact with at least a portion of the first major surface of the adhesive layer; and a structured releasing substrate with a first major surface and a second major surface, wherein the second major surface comprises a structured surface comprising a series of protrusions and depressions on the surface of the releasing substrate, and having a fluorinated release layer on the surface of the releasing substrate; and wherein at least a portion of the second major surface of the releasing substrate is in contact with the electrical circuit.

Embodiment 87 is the multilayer article of embodiment 86, wherein the series of protrusions and depressions on the surface of the releasing substrate comprise a pattern of hemispheres, prisms, pyramids, ellipses, grooves, or channels.

Embodiment 88 is the multilayer article of embodiment 86 or 87, wherein the electrical circuit comprises metal.

Embodiment 89 is the multilayer article of embodiment 88, wherein the metal comprises copper, chromium, aluminum, nickel, gold, silver, tungsten or combinations thereof.

Embodiment 90 is the multilayer article of embodiment 86 or 87, wherein the electrical circuit comprises a conductive or semiconductive metal oxide.

Embodiment 91 is the multilayer article of embodiment 90, wherein the conductive or semiconductive metal oxide comprises binary metal oxides comprising zinc oxide, titania, tin oxide, alumina, indium oxide, magnesia, zirconia, barium oxide, molybdenum trioxide, tungsten trioxide, and vanadium pentoxide; or doped conductive metal oxides comprising Sb-doped tin oxide, Al-doped zinc oxide, In-doped zinc oxide, In-doped tin oxide, and Sb-doped zinc oxide.

Embodiment 92 is the multilayer article of any of embodiments 86-91, wherein the electrical circuit has a thickness of from 100 nanometers to 1 micrometer.

Embodiment 93 is the multilayer article of any of embodiments 86-92, wherein the protrusions of the structured release layer comprise an average cross sectional width of from 1.0 to 3.0 millimeters.

Embodiment 94 is the multilayer article of any of embodiments 86-93, wherein the electrical circuit on the surface of the adhesive layer comprises, an RFID antenna, an LED circuit, an EMI shield, a wearable electronic sensor, or a touch screen circuit.

Embodiment 95 is the multilayer article of any of embodiments 86-94, wherein the adhesive layer comprises an optically clear adhesive layer.

Embodiment 96 is the multilayer article of any of embodiments 86-95, wherein the adhesive layer comprises a (meth) acrylate-based pressure sensitive adhesive or a silicone-based pressure sensitive adhesive.

Embodiment 97 is the multilayer article of any of embodiments 86-96, wherein the adhesive layer comprises a electrically conductive adhesive layer.

Embodiment 98 is the multilayer article of any of embodiments 86-97, wherein the releasing substrate has been removed to expose the electrical circuit and the adhesive layer.

Embodiment 99 is the multilayer article of embodiment 98, wherein the exposed electrical circuit and adhesive layer are in contact with the surface of a second substrate.

Embodiment 100 is the multilayer article of embodiment 99, wherein the second substrate comprises a rigid, a semi-rigid or a flexible substrate.

Embodiment 101 is the multilayer article of embodiment 100, wherein the second substrate comprises a rigid substrate selected from glass plates, polymeric plates of polycarbonate (PC) or polymethylmethacrylate (PMMA), ceramics, metal plates, or the external surface of device.

Embodiment 102 is the multilayer article of embodiment 100, wherein the second substrate comprises a semi-rigid substrate selected from monolithic polymeric films, or multilayer polymeric films.

Embodiment 103 is the multilayer article of embodiment 100, wherein the second substrate comprises a flexible substrate selected from tape backings, optical films, non-optical films, and release liners.

Embodiment 104 includes a multilayer article comprising: a structured adhesive layer comprising a first major surface and a second major surface wherein the second major surface comprises a structured surface comprising a series of protrusions and depressions on the surface of the second major surface of the adhesive layer; an electrical circuit in contact with at least a portion of the second major surface of the adhesive layer; and a releasing substrate with a first major surface and a second major surface, and having a fluorinated release layer on the first major surface of the releasing substrate; and wherein at least a portion of the first major surface of the releasing substrate is in contact with the electrical circuit.

Embodiment 105 is the multilayer article of embodiment 104, wherein the series of protrusions and depressions on the surface of the adhesive layer comprise a pattern of hemispheres, prisms, pyramids, ellipses, grooves, or channels.

Embodiment 106 is the multilayer article of embodiment 104 or 105, wherein the electrical circuit comprises metal.

Embodiment 107 is the multilayer article of embodiment 106, wherein the metal comprises copper, chromium, aluminum, nickel, gold, silver, tungsten or combinations thereof.

Embodiment 108 is the multilayer article of embodiment 104 or 105, wherein the electrical circuit comprises a conductive or semiconductive metal oxide.

Embodiment 109 is the multilayer article of embodiment 108, wherein the conductive or semiconductive metal oxide comprises binary metal oxides comprising zinc oxide, titania, tin oxide, alumina, indium oxide, magnesia, zirconia, barium oxide, molybdenum trioxide, tungsten trioxide, and vanadium pentoxide; or doped conductive metal oxides comprising Sb-doped tin oxide, Al-doped zinc oxide, In-doped zinc oxide, In-doped tin oxide, and Sb-doped zinc oxide.

Embodiment 110 is the multilayer article of any of embodiments 104-109, wherein the electrical circuit has a thickness of from 50 to 100 nanometers.

Embodiment 111 is the multilayer article of any of embodiments 104-110, wherein the electrical circuit on the surface of the adhesive layer comprises, an RFID antenna, an LED circuit, an EMI shield, a wearable electronic sensor, or a touch screen circuit.

Embodiment 112 is the multilayer article of any of embodiments 104-111, wherein the adhesive layer comprises an optically clear adhesive layer.

Embodiment 113 is the multilayer article of any of embodiments 104-112, wherein the adhesive layer comprises a (meth)acrylate-based pressure sensitive adhesive.

Embodiment 114 is the multilayer article of any of embodiments 104-113, wherein the releasing substrate has been removed to expose the electrical circuit and the adhesive layer.

Embodiment 115 is the multilayer article of embodiment 114, wherein the exposed electrical circuit and adhesive layer are in contact with the surface of a second substrate.

Embodiment 116 is the multilayer article of embodiment 115, wherein the second substrate comprises a rigid, a semi-rigid or a flexible substrate.

Embodiment 117 is the multilayer article of embodiment 116, wherein the second substrate comprises a rigid substrate selected from glass plates, polymeric plates of polycarbonate (PC) or polymethylmethacrylate (PMMA), ceramics, metal plates, or the external surface of device.

Embodiment 118 is the multilayer article of embodiment 116, wherein the second substrate comprises a semi-rigid substrate selected from monolithic polymeric films, or multilayer polymeric films.

Embodiment 119 is the multilayer article of embodiment 116, wherein the second substrate comprises a flexible substrate selected from tape backings, optical films, non-optical films, and release liners.

Embodiment 120 is the multilayer article of any of embodiments 104-119, wherein the structured adhesive layer comprises an electrically conductive adhesive layer.

Embodiment 121 includes a multilayer article comprising: an adhesive layer comprising a first major surface and a second major surface; an electrical circuit in contact with at least a portion of the second major surface of the adhesive layer, wherein the electrical circuit comprises electrical circuit elements comprising discontinuous conductive material; and a releasing substrate with a first major surface and a second major surface, and having a fluorinated release layer on the first major surface of the releasing substrate; and wherein at least a portion of the first major surface of the releasing substrate is in contact with the electrical circuit and in contact with the second major surface of the adhesive layer.

Embodiment 122 is the multilayer article of embodiment 121, wherein the electrical circuit elements comprise metal.

Embodiment 123 is the multilayer article of embodiment 122, wherein the metal comprises copper, chromium, aluminum, nickel, gold, silver, tungsten or combinations thereof.

Embodiment 124 is the multilayer article of embodiment 121, wherein the circuit elements comprise a conductive or semiconductive metal oxide.

Embodiment 125 is the multilayer article of embodiment 124, wherein the conductive or semiconductive metal oxide comprises binary metal oxides comprising zinc oxide, titania, tin oxide, alumina, indium oxide, magnesia, zirconia, barium oxide, molybdenum trioxide, tungsten trioxide, and vanadium pentoxide; or doped conductive metal oxides comprising Sb-doped tin oxide, Al-doped zinc oxide, In-doped zinc oxide, In-doped tin oxide, and Sb-doped zinc oxide.

Embodiment 126 is the multilayer article of any of embodiments 121-125, wherein the electrical circuit has a thickness of from 50 to 100 nanometers.

Embodiment 127 is the multilayer article of any of embodiments 121-126, wherein the electrical circuit on the surface of the adhesive layer comprises, an RFID antenna, an LED circuit, an EMI shield, a wearable electronic sensor, or a touch screen circuit.

Embodiment 128 is the multilayer article of any of embodiments 121-127, wherein the adhesive layer comprises an optically clear adhesive layer.

Embodiment 129 is the multilayer article of any of embodiments 121-128, wherein the adhesive layer comprises a (meth)acrylate-based pressure sensitive adhesive or silicone-based pressure sensitive adhesive.

Embodiment 130 is the multilayer article of any of embodiments 121-129, wherein the adhesive layer comprises an electrically conductive adhesive layer.

Embodiment 131 is the multilayer article of any of embodiments 121-130, wherein the releasing substrate has been removed to expose the electrical circuit and the adhesive layer.

Embodiment 132 is the multilayer article of embodiment 131, wherein the exposed electrical circuit and adhesive layer are in contact with the surface of a second substrate.

Embodiment 133 is the multilayer article of embodiment 132, wherein the second substrate comprises a rigid, a semi-rigid or a flexible substrate.

Embodiment 134 is the multilayer article of embodiment 133, wherein the second substrate comprises a rigid substrate selected from glass plates, polymeric plates of polycarbonate (PC) or polymethylmethacrylate (PMMA), ceramics, metal plates, or the external surface of device.

Embodiment 135 is the multilayer article of embodiment 133, wherein the second substrate comprises a semi-rigid substrate selected from monolithic polymeric films, or multilayer polymeric films.

Embodiment 136 is the multilayer article of embodiment 133, wherein the second substrate comprises a flexible substrate selected from tape backings, optical films, non-optical films, and release liners.

EXAMPLES

Unless otherwise noted, all parts, percentages, ratios, etc. in the Examples and the rest of the specification are by weight. Common abbreviations are used such as mm for millimeters, and lbs for pounds.

Test Methods and Preparation Procedures

Structured Polymeric Sheet

A polypropylene film sheet with down web channels was formed by extrusion replication, where the replicated article takes on the inverse structure of a replication master tool. This film sheet was made with ExxonMobil PP1024 polypropylene homo-polymer resin. Structured articles can be described by three parameters: pitch, which is defined as the distance from a point on one structure to the corresponding point on the next closest structure; height which is the height of the protrusions above the base or "land" as it is sometimes called, the height of the protrusions can alternatively be viewed as the depth of the depression; and width, the width of the depressions. These features are shown in FIG. 1a with Pitch being "P", Height "H", and Width "W". In these examples, the pitch was 3.00 mm, the height was 0.17 mm, and width was 0.20 mm.

Unstructured Polymeric Sheet

The unstructured polymeric sheet used in Examples 3 and 4 was a 5 mil (127 micrometer) thick PET (polyethylene terephthalate) film.

Adhesive Tape

The adhesive tape was prepared from the adhesive transfer tape "3M OCA 8172", commercially available from 3M Company, St. Paul, Minn. which was laminated onto 5 mil (127 micrometer) thick PET (polyethylene terephthalate) film.

Embossing Tool

An aluminum embossing tool was made by standard CNC machining means. Embossing tools are defined by the same parameters as are used to define the Structured polymeric sheet above, namely pitch, height, and width as shown in FIG. 3d. In the embossing tool embossing tool used in the present examples, the pitch was 3.00 mm, the height was 0.18 mm, and the width was 0.20 mm.

Structured Adhesive Tape

The structured adhesive tape was prepared from the adhesive transfer tape "3M OCA 8172", commercially available from 3M Company, St. Paul, Minn. One release liner was removed and the adhesive surface was laminated onto 5 mil (127 micrometer) thick PET (polyethylene terephthalate) film to form a tape with a release liner on the other adhesive surface. The adhesive tape was embossed through the release liner side using the Embossing tool, in a hydraulic heat press. The hydraulic heat press was set to 350° F. (177° C.) and the pressure was set to 20,000 lbs (89,000 Newtons) for 7 minutes.

Plasma Treatment for Release Surface

The plasma treatments to generate a fluorochemical release surface were run as described in the Application: 62/066,130 titled "Insulated Glazing Units and Microoptical Layer Comprising Microstructured Diffuser and Methods" filed Oct. 20, 2014. The plasma treatments were carried out in a vacuum batch coater using $C_3F_8$ at 150 SCCM as the process gas, plasma power at 1000 Watts for 2 minutes duration.

Metallization Process

The conductive layers of copper metal were deposited by conventional vapor deposition methods to form films of 0.2 micrometer thickness, except for Example 4 in which the metal thickness was 50 nanometers.

Electrical Continuity Test

The electrical continuity of traces were checked using a handheld Fluke 115 multimeter and resistance values were recorded in Ohms.

EXAMPLES

Example 1: Electrical Circuit Transferred from Structured Polymeric Film

For this example, a structured polymeric sheet was release coated as shown in FIG. 1b using the plasma treatment process and then metallized as shown in FIG. 1c. The adhesive tape was contacted to the metallized structured side of the resulting releasing substrate article as shown in FIG. 1d. Upon peeling the adhesive tape from the releasing substrate article, that portion of the metal coatings which were in direct contact with the adhesive tape were removed from the film tool, resulting in the releasing substrate shown in FIG. 1e and the electrical circuit (also called transferred conductive patterns) located on an adhesive layer shown in FIG. 1f. Electrical resistance of the electrical circuit on the adhesive tape were measured and electrical discontinuity (as evidenced by a resistance of "open") between traces was confirmed.

TABLE 1

Electrical resistance of transferred conductive patterns in Example 1

| Lines | Resistance (ohm) down lines | Distance (mm) between probed contacts | resistance (ohm) between adjacent lines | Distance (mm) between lines | Line width (mm) |
|---|---|---|---|---|---|
| 1 | 520 | 150 | open | 2.84 | 2.764 |
| 2 | 768 | 149 | open | 2.76 | 2.723 |
| 3 | 870 | 146 | open | 2.98 | 2.761 |

Example 2: Pattern Negative Transferred from Structured Polymeric Film

For this example, a process similar to Example 1 was followed in which a structured polymeric sheet was release coated and metallized. Also like Example 1, the adhesive tape was contacted to the metallized structured side of the releasing substrate and the adhesive tape was peeled from the releasing substrate to generate the article shown in FIG. 2a (which is the same as the article of FIG. 1e). Unlike Example 1 in which the metal located on the protrusions of the releasing substrate was transferred to produce the electrical circuit on an adhesive layer, in this example the residual metal contained within the depressions of the releasing substrate were transferred to an adhesive layer to generate an electrical circuit. To the article of FIG. 2a containing metal in the depressions of the releasing substrate was coated a UV-curable liquid adhesive (NOA 72 available from Norland) and the liquid adhesive layer was overlaid with 5 mil (127 micrometer) thick PET film backing, as shown in FIG. 2b. The resulting article was cured with UV light following the directions provided by the manufacturer of the liquid adhesive. Upon peeling the PET film backing and UV-cured adhesive layer from the releasing substrate, the residual metal transferred to the UV-cured adhesive layer to generate the metal-free releasing substrate shown in FIG. 2c, and the electrical circuit (also called transferred conductive patterns) located on an adhesive layer shown in FIG. 2d. In this manner, the circuit formed in Example 2 can be viewed as an image-wise negative pattern of the circuit generated in Example 1. Electrical resistance of the traces on the adhesive transfer tape were measured and electrical discontinuity (as evidenced by a resistance of "open") between traces was confirmed.

TABLE 2

Electrical resistance of transferred conductive patterns in Example 2

| Lines | Resistance (ohm) down lines | Distance (mm) between probed contacts | resistance (ohm) between adjacent lines | Distance (mm) between lines | Line width (mm) |
|---|---|---|---|---|---|
| 1 | 40 | 51 | open | 3.01 | 0.237 |
| 2 | 37 | 51 | open | 3.01 | 0.251 |
| 3 | 37 | 53 | open | 2.99 | 0.25 |

Example 3: Metal Pattern Transferred from Embossed Metalized Release Liner

For this example, an unstructured polymeric sheet shown in FIG. 3a was plasma treated to generate a release surface as shown in FIG. 3b, and metalized as shown in FIG. 3c. To provide topography to this releasing substrate, the protrusions of the embossing tool (described above and shown in FIG. 3d) was applied to the metalized surface of the unstructured releasing substrate in a hydraulic heat press. The hydraulic heat press was set to 350° F. (177° C.) and the pressure was set to 20,000 lbs (89,000 Newtons) for 5 minutes as shown in FIG. 3e. The embossing step transformed the previously unstructured releasing substrate into a releasing substrate with topographical structure. The resulting article is shown in FIG. 3f and is very similar to the article of FIG. 1c except that the embossing process broke the continuity of the metal layer, so that no metal is present on the sides of the depression of the article of FIG. 3f. The adhesive tape was contacted to the metallized structured side of the resulting releasing substrate shown in FIG. 3f to generate the article as shown in FIG. 3g. Upon peeling the adhesive tape from the releasing substrate article, that portion of the metal coatings which were in direct contact with the adhesive tape were removed from the film tool, resulting in the releasing substrate shown in FIG. 3h and the electrical circuit (also called transferred conductive patterns) located on an adhesive layer shown in FIG. 3i. Electrical resistance of the electrical circuit on the adhesive tape were measured and electrical discontinuity (as evidenced by a resistance of "open") between traces was confirmed.

TABLE 3

Electrical resistance of transferred conductive patterns in Example 3

| Lines | Resistance (ohm) down lines | Distance (mm) between probed contacts | resistance (ohm) between adjacent lines | Distance (mm) between lines | Line width (mm) |
|---|---|---|---|---|---|
| 1 | 5.9 | 18 | open | 3.033 | 2.389 |
| 2 | 3.4 | 20.2 | open | 2.957 | 2.324 |
| 3 | 4.6 | 20.43 | open | 3.008 | 2.38 |

Example 4: Metal Pattern Transferred Using Embossed Adhesive Tape

For this example, an unstructured polymeric sheet shown in FIG. 4a was plasma treated to generate a release surface as shown in FIG. 4b, and metalized as shown in FIG. 4c. This is very similar to the procedure described in Example 3 above, except in this instance the metal layer was only 50 nanometers thick (as opposed to 0.20 mm in Example 3). An adhesive tape with a structured topography (described above and shown in FIG. 4d) was contacted to the metalized surface of the unstructured releasing substrate. The resulting article is shown in FIG. 4e. Upon peeling the adhesive tape from the releasing substrate article, that portion of the metal coatings which were in direct contact with the protrusions of the adhesive tape were removed from the releasing substrate, resulting in the releasing substrate shown in FIG. 4f and the electrical circuit (also called transferred conductive patterns) located on an adhesive layer shown in FIG. 4g.

The releasing substrate shown in FIG. 4f comprises portions of exposed release surface and portions of thin metal. To this article was coated a UV-curable liquid adhesive (NOA 72 available from Norland) and the liquid adhesive layer was overlaid with 5 mil (127 micrometer) thick PET film backing, as shown in FIG. 4g. The resulting article was cured with UV light following the directions provided by the manufacturer of the liquid adhesive. Upon peeling the PET film backing and UV-cured adhesive layer from the releasing substrate, the residual metal transferred to the UV-cured adhesive layer to generate the metal-free releasing substrate shown in FIG. 4h, and the electrical circuit (also called transferred conductive patterns) located on an adhesive layer shown in FIG. 4i. In this manner, the circuit formed in this portion of the Example can be viewed as an image-wise negative pattern of the circuit generated in the first part of the Example. Electrical resistance of the traces on the adhesive transfer tape were measured and electrical discontinuity (as evidenced by a resistance of "open") between traces was confirmed.

TABLE 4

Electrical resistance of transferred conductive patterns in Example 4

| Lines | Resistance (ohm) down lines | Distance (mm) between probed contacts | resistance (ohm) between adjacent lines | Distance (mm) between lines | Line width (mm) |
|---|---|---|---|---|---|
| 1 | 157 | 13.1 | open | 2.95 | 0.390 |
| 2 | 147 | 6.2 | open | 2.59 | 0.326 |
| 3 | 224 | 10.7 | open | 2.66 | 0.289 |

Comparative Example C1: Embossed Adhesive Tape with Non-Release Substrate

For this example, an unstructured polymeric sheet as used in Example 4 above was used without plasma treatment and was metalized to give a metal layer of 50 nanometers thickness. An adhesive tape with a structured topography as described above in Example 4 was contacted to the metalized surface of the unstructured substrate. Upon peeling the adhesive tape from the substrate, no metal was transferred to the adhesive.

What is claimed is:
1. A method of preparing an electrical circuit on a surface comprising:
   providing a structured releasing first substrate comprising a series of protrusions and depressions on the surface of the releasing first substrate, and having a fluorinated release layer on the surface of the releasing first substrate, wherein the fluorinated release layer comprises a release surface prepared by plasma deposition;

preparing a layer of circuit-forming material on the release layer on the surface of the structured releasing first substrate;

providing an adhesive layer;

contacting the adhesive layer to the circuit-forming material on protrusions of the structured releasing first substrate; and removing the adhesive layer from the surface of the structured releasing first substrate, such that at least a portion of the circuit-forming material on the protrusions of the structured releasing first substrate at least partially adheres to the surface of the adhesive layer upon removal to form an adhesive surface with an electrical circuit on it.

2. The method of claim 1, wherein the series of protrusions and depressions on the surface of the releasing first substrate comprise a pattern of hemispheres, prisms, pyramids, ellipses, grooves, or channels.

3. The method of claim 1, wherein the circuit-forming layer comprises a layer of metal.

4. The method of claim 1, wherein the protrusions of the structured release layer comprise an average cross sectional width of from 1.0 to 3.0 millimeters.

5. The method of claim 1, wherein the electrical circuit on the surface of the adhesive layer is in a pattern that corresponds with the pattern of protrusions of the releasing first substrate.

6. The method of claim 1, wherein the electrical circuit on the surface of the adhesive layer comprises, an RFID antenna, an LED circuit, an EMI shield, a wearable electronic sensor, or a touch screen circuit.

7. The method of claim 1, wherein the adhesive layer comprises a conductive adhesive layer.

8. The method of claim 1, further comprising contacting the adhesive surface with an electrical circuit on it to the surface of a second substrate to form a laminate construction.

9. A method of preparing an electrical circuit on a surface comprising:

providing a structured releasing first substrate comprising a series of protrusions and depressions on the surface of the releasing substrate, and having a fluorinated release layer on the surface of the releasing substrate, wherein the fluorinated release layer comprises a release surface prepared by plasma deposition;

preparing a layer of circuit-forming material on the release layer on the surface of the structured releasing first substrate;

removing the circuit-forming material from the protrusions of the releasing first substrate;

providing an adhesive or a pre-adhesive layer;

contacting the adhesive layer or the pre-adhesive layer to the circuit-forming material in the depressions of the structured releasing first substrate;

if the adhesive layer is a pre-adhesive layer, curing the pre-adhesive layer to form an adhesive layer; and removing the adhesive layer from the surface of the structured releasing substrate, such that at least a portion of the circuit-forming material in the depressions of the structured releasing first substrate at least partially adheres to the surface of the adhesive layer upon removal to form an adhesive surface with an electrical circuit on it.

10. The method of claim 9, wherein the circuit-forming layer comprises a layer of metal.

11. The method of claim 9, wherein removing the circuit-forming material from the protrusions of the releasing first substrate comprises adhesive transfer, wiping, or vacuum removal.

12. The method of claim 9, wherein the pre-adhesive layer comprises a UV-curable composition or a thermoset composition.

13. A method of preparing an electrical circuit on a surface comprising:

providing an unstructured releasing first substrate having a fluorinated release layer on the surface of the releasing first substrate wherein the fluorinated release layer comprises a release surface prepared by plasma deposition;

preparing a layer of circuit-forming material on the release layer on the surface of the releasing first substrate;

providing an embossing tool comprising a surface with protrusions and depressions;

embossing the embossing tool against the layer of circuit-forming material on the release layer on the surface of the releasing first substrate with pressure to prepare an embossed surface in the layer of circuit-forming material on the release layer on the surface of the releasing first substrate;

removing the embossing tool from the layer of circuit-forming material on the release layer on the surface of the releasing first substrate;

providing an adhesive layer;

contacting the adhesive layer to the circuit-forming material on the embossed protrusions of the embossed surface of the releasing first substrate; and removing the adhesive layer from the embossed surface of the releasing first substrate, such that at least a portion of the circuit-forming material on the embossed protrusions of the releasing first substrate at least partially adheres to the surface of the adhesive layer upon removal to form an adhesive surface with an electrical circuit on it.

14. The method of claim 13, wherein the circuit-forming layer comprises a layer of metal.

15. The method of claim 13, further comprising contacting the adhesive surface with an electrical circuit on it to the surface of a second substrate to form a laminate construction.

16. A method of preparing an electrical circuit on a surface comprising:

providing an unstructured releasing first substrate having a fluorinated release layer on the surface of the releasing first substrate, wherein the fluorinated release layer comprises a release surface prepared by plasma deposition;

preparing a layer of circuit-forming material on the release layer on the surface of the releasing first substrate;

providing a structured adhesive layer comprising a surface with protrusions and depressions;

contacting the structured adhesive layer against the layer of circuit-forming material on the release layer on the surface of the releasing first substrate such that only the protrusions of the structured adhesive layer contact the layer of circuit-forming material;

removing the adhesive layer from the releasing substrate, such that at least a portion of the circuit-forming material on the protrusions of the structured adhesive layer at least partially adheres to the surface of the adhesive layer upon removal to form an adhesive surface with an electrical circuit on it.

17. The method of claim 16, further comprising:
contacting a curable liquid adhesive to the surface of the releasing first substrate from which portions of circuit-forming material have been removed;
curing the liquid adhesive to form an adhesive layer; and
removing the adhesive layer such that at least a portion of the circuit-forming material on the releasing substrate at least partially adheres to the surface of the adhesive layer upon removal to form an adhesive surface with an electrical circuit on it.

18. The method of claim 16, wherein the circuit-forming layer comprises a layer of metal with a thickness of less than 100 nanometers.

19. The method of claim 17, further comprising contacting the adhesive surface with an electrical circuit on it to the surface of a second substrate to form a laminate construction.

20. A multilayer article comprising:
an adhesive layer comprising a first major surface and a second major surface;
an electrical circuit in contact with at least a portion of the first major surface of the adhesive layer; and
a structured releasing first substrate with a first major surface and a second major surface, wherein the second major surface comprises a structured surface comprising a series of protrusions and depressions on the surface of the releasing first substrate, and having a fluorinated release layer on the surface of the releasing first substrate, wherein the fluorinated release layer comprises a release surface prepared by plasma deposition; and
wherein at least a portion of the second major surface of the releasing first substrate is in contact with the electrical circuit.

21. The multilayer article of claim 20, wherein the releasing first substrate has been removed to expose the electrical circuit and the adhesive layer.

22. The multilayer article of claim 21, wherein the exposed electrical circuit and adhesive layer are in contact with the surface of a second substrate.

23. The multilayer article of claim 20, wherein the adhesive layer comprises an electrically conductive adhesive layer.

* * * * *